United States Patent
Ulen

(10) Patent No.: US 10,871,961 B2
(45) Date of Patent: Dec. 22, 2020

(54) SECURITY SYSTEM WITH SMART CONNECTION MODULE

(71) Applicant: Alarm.com Incorporated, Tysons, VA (US)

(72) Inventor: Colin Ulen, Cambridge, MA (US)

(73) Assignee: Alarm.com Incorporated, Tysons, VA (US)

( * ) Notice: Subject to any disclaimer, the term of this patent is extended or adjusted under 35 U.S.C. 154(b) by 0 days.

(21) Appl. No.: 16/590,839

(22) Filed: Oct. 2, 2019

(65) Prior Publication Data

US 2020/0104117 A1 Apr. 2, 2020

Related U.S. Application Data

(60) Provisional application No. 62/740,082, filed on Oct. 2, 2018.

(51) Int. Cl.
| | |
|---|---|
| *G08B 26/00* | (2006.01) |
| *G06F 8/654* | (2018.01) |
| *H05K 7/14* | (2006.01) |
| *H05K 1/02* | (2006.01) |

(52) U.S. Cl.
CPC ........... *G06F 8/654* (2018.02); *G08B 26/004* (2013.01); *G08B 26/008* (2013.01); *H05K 1/0215* (2013.01); *H05K 7/1451* (2013.01)

(58) Field of Classification Search
None
See application file for complete search history.

(56) References Cited

U.S. PATENT DOCUMENTS

| | | | | |
|---|---|---|---|---|
| 5,710,908 | A * | 1/1998 | Man | H04L 29/06 709/230 |
| 5,758,070 | A * | 5/1998 | Lawrence | H04L 29/06 709/220 |
| 5,794,007 | A * | 8/1998 | Arrigotti | G06F 9/4401 714/720 |
| 5,828,864 | A * | 10/1998 | Danknick | G06F 11/3485 703/24 |
| 6,341,320 | B1 * | 1/2002 | Watts, Jr. | G06F 1/1632 361/679.42 |
| 6,488,585 | B1 * | 12/2002 | Wells | G07F 17/3241 463/43 |
| 6,539,438 | B1 * | 3/2003 | Ledzius | G06F 15/7867 710/16 |

(Continued)

*Primary Examiner* — Julie B Lieu
(74) *Attorney, Agent, or Firm* — Fish & Richardson P.C.

(57) ABSTRACT

Systems and techniques are described for a sensor designed to connect to and monitor devices in an ecosystem. In some implementations, a system monitors a property that includes the sensor configured to generate sensor data reflecting an attribute of the property. The sensor includes a host board that generates the sensor data and a core board connected to the host board. The core board identifies a type of the host board and communicates with a monitor control unit. The monitor control unit receives a request for firmware associated with the type of the host board from the sensor. In response, the monitor control unit accesses the firmware and transmits the firmware to the sensor. The core board of the sensor receives the firmware and stores the firmware. The core board receives the sensor data from the host board and transmits the sensor data to the monitor control unit.

20 Claims, 11 Drawing Sheets

(56) References Cited

U.S. PATENT DOCUMENTS

| | | | |
|---|---|---|---|
| 6,574,688 | B1 | 6/2003 | Dale et al. |
| 6,754,863 | B1 * | 6/2004 | Grannis, III ....... G01R 31/2815 |
| | | | 714/729 |
| 6,920,416 | B1 * | 7/2005 | Swoboda .............. G06F 11/261 |
| | | | 703/13 |
| 7,936,572 | B2 | 5/2011 | Busse et al. |
| 8,589,018 | B2 * | 11/2013 | Sarnacke ............. G07C 5/0808 |
| | | | 701/29.2 |
| 2008/0306960 | A1 * | 12/2008 | Poechmueller ......... H04L 67/12 |
| 2012/0314368 | A1 | 12/2012 | Liang |
| 2014/0330999 | A1 * | 11/2014 | Glickman ........... G06F 13/1694 |
| | | | 710/306 |
| 2015/0341185 | A1 * | 11/2015 | Keller .................. G05B 19/042 |
| | | | 700/86 |
| 2018/0365187 | A1 * | 12/2018 | Glickman ............... G06F 13/28 |
| 2019/0239826 | A1 * | 8/2019 | Yang ...................... G16H 30/00 |

\* cited by examiner

SECURITY SYSTEM WITH SMART CONNECTION MODULE

CROSS-REFERENCE TO RELATED APPLICATION

This application claims the benefit of U.S. Provisional Application No. 62/740,082, filed on Oct. 2, 2018, which is incorporated herein by reference.

TECHNICAL FIELD

This specification relates generally to a smart module device designed to connect to and monitor various devices in a particular ecosystem.

BACKGROUND

Embedded systems can include microcontrollers and microprocessors for receiving and processing data from various devices. An embedded system is typically dedicated to specific designs, ranging from portable devices such as digital watches, MP3 players, to large complex systems, such as hybrid vehicles, medical imaging, and computer equipment racks.

SUMMARY

The subject matter of the present disclosure is related to a smart connection module for connecting and monitoring devices found in any location. This module is a device agnostic platform that allows developers to build, innovate, and integrate devices to access an ecosystem provided by the module in a streamlined fashioned. The devices can include sensors, such as smoke alarms, motion detectors, weather detectors, and carbon monoxide detectors, home devices, such as garage controllers, door locks, window locks, and light bulbs, and other various devices found in a property. In particular, the ecosystem provides functionality relating to monitoring, delegating infrastructure, providing security, and providing access to each of its smart connection modules. By integrating devices on the module, developers can quickly push their devices and test their corresponding functionality in a quick time to market fashion. Additionally, a user's device will have gained the benefit of the ecosystem that provides various functionality. In order for customers to integrate their devices to the smart connection module, each device is implemented on a host board found in the smart connection module. The host board includes a customizable set of product specific components related to the developer's device, such as modules, functions, software, firmware, communication protocols, and registry data, to allow seamless integration with the smart connection module. The smart connection module connects the product specific host board to the ecosystem through the connection of a core board. The core board is a standardized device that can be connected to any product specific host board and have communications from the product specific host board streamlined and standardized to be understood by the ecosystem.

In one general aspect, a monitoring system that is configured to monitor a property, the monitoring system including: a sensor that is configured to generate sensor data that reflects an attribute of the property and that includes: a host board that is configured to generate the sensor data; and a core board that is connected to the host board, that is configured to identify a type of the host board, and that is configured to communicate with a monitor control unit; and the monitor control unit that is configured to: receive, from the core board of the sensor, a request for firmware associated with the type of the host board; in response to receiving the request for firmware associated with the type of the host board, access the firmware associated with the type of the host board; and transmit, to the core board of the sensor, the firmware associated with the type of the host board, wherein the core board of the sensor is configured to: receive the firmware associated with the type of the host board; store the firmware associated with the type of the host board; receive, from the host board, the sensor data; and transmit, to the monitor control unit, the sensor data.

Implementations may include one or more of the following features. For example, in some implementations, the core board is configured to: connect to the host board through an adaptable connector that comprises one or more pin connectors; retrieve the firmware associated with the type of the host board from a memory of the core board; and configure a function of the one or more pin connectors based on the firmware associated with the type of the host board.

In some implementations, the system includes the one or more pin connectors comprises multi-function pins and single function pins, and a function of each of the multi-function pins is configured to change based on the type of the host board.

In some implementations, a pin connector layout of the adaptable connector includes 22 multi-function purpose pins, 23 power and ground pins, and 21 single function pins.

In some implementations, the core board is configured to: maintain the one or more pin connectors in RESET mode until configuring the function of the one or more pin connectors based on the firmware associated with the type of the host board.

In some implementations, the core board is configured to identify a type of the host board by: transmitting a request to a memory of the host board; and receiving data identifying the type of the host board from the memory of the host board.

In some implementations, the data identifying the type of the host board includes unique serial information of the host board, data indicating a product type of the host board, and a pin configuration for the one or more pin connectors based on the product type of the host board.

In some implementations, the monitor control unit is configured to receive the request for firmware associated with the type of the host board by: receiving unique serial information associated with a product type of the host board and data instructing the monitor control unit to transmit a request to a security server for the requested firmware.

In some implementations, the monitor control unit is configured to: in response to accessing the firmware associated with the type of the host board, transmit a notification to a client device indicating that firmware has been requested for the core board; transmit the firmware to the core board; receive a notification from the core board indicating that the core board is configured to communicate with the host board; and in response to receiving the notification from the core board indicating that the core board is configured to communicate with the host board, transmit an additional notification to the client device indicating that the core board is functioning properly with the host board.

In some implementations, the core board includes one or more add-on boards that provide additional functionality to the core board and the host board.

In some implementations, the core board is configured to: connect to an additional host board that is different from the host board; identify a type of the additional host board; determine additional firmware corresponding to the additional host board is not locally found on the core board; transmit a request to the monitor control unit for the additional firmware; receive the additional firmware from the monitor control unit; and configure a function of one or more pin connectors based on the additional firmware associated with a type of the additional host board.

In some implementations, the type of the additional host board is a thermostat specific host board and the type of the host board is a smoke sensor specific host board.

Other embodiments of this and other aspects of the disclosure include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue having instructions that, when executed by data processing apparatus, cause the apparatus to perform the actions.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Figure 1:
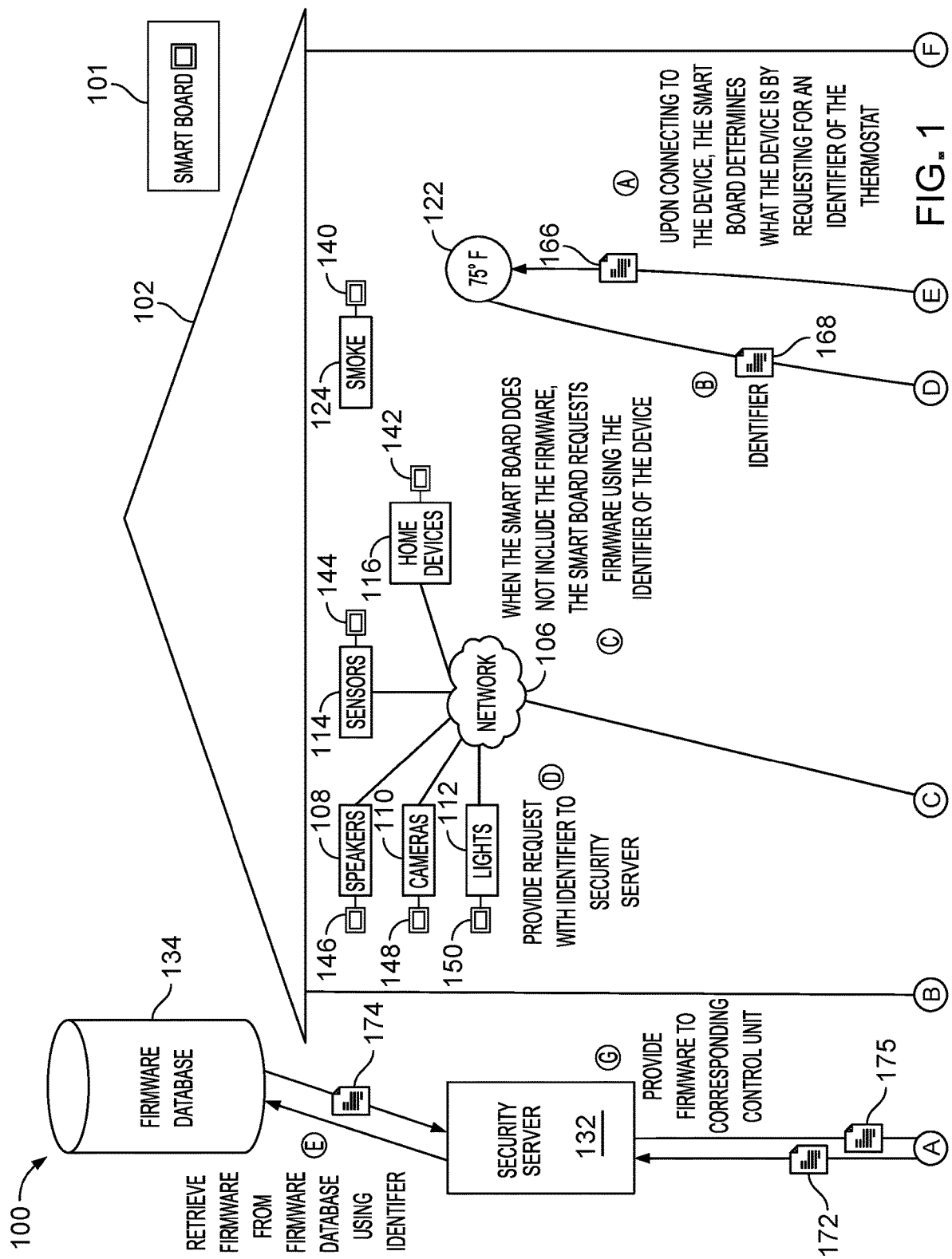
FIG. 1 is a contextual diagram of an example monitoring system that includes multiple devices that use smart connection modules to communicate with the example monitoring system.
Figure 1:
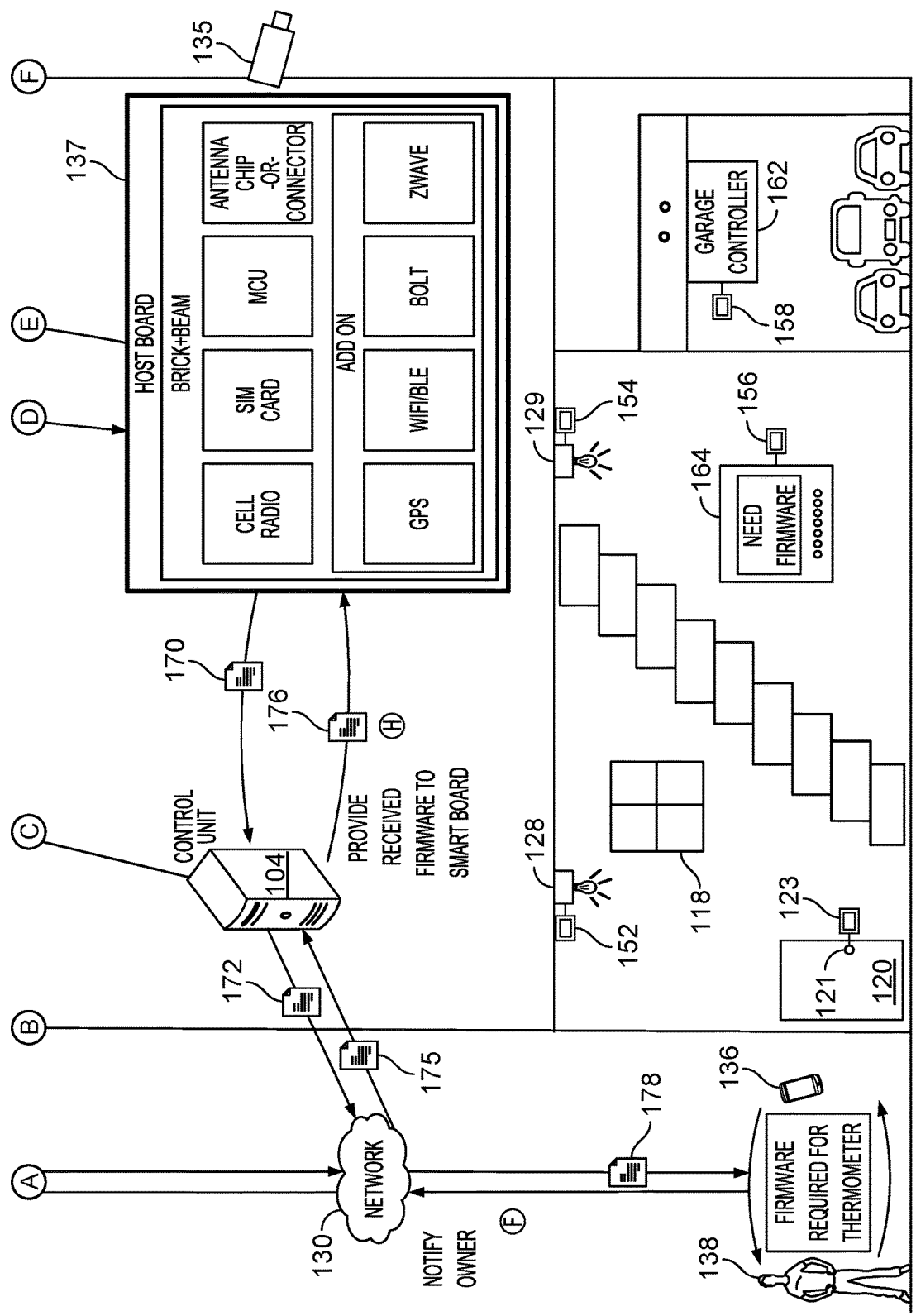

FIG. 1 is a contextual diagram of an example system 100 for connecting one or more devices to communicate with smart connection modules. Though system 100 is shown and described with a particular set of components in a monitored property 102, such as a control unit 104, network 106, speakers 108, cameras 110, lights 112, sensors 114, home devices 116, network 130, security server 132, and a smart connection module 141, the present disclosure need not be so limited. For instance, in some implementations, only a subset of the aforementioned components may be used by the system 100 for connecting one or more devices to communicate with smart connection modules. As an example, there may be a system 100 that does not user speakers 108. Similarly, there may be implementations where the control unit, such as control unit 104, is stored in the security server 132. In other implementations, the system 100 can include more than one smart connection module 141. For example, the system 100 can include a smart connection module corresponding to each device in the monitored property 102. There may be implementations that the security server 132 is stored in the control unit 104. Yet other alternative systems also fall within the scope of the present disclosure such as a system 100 that does not use a control unit 104. Rather, these systems would communicate directly with the security server 132 to perform the monitoring. For these reasons, the system 100 should not be viewed as limiting the present disclosure to any particular set of necessary components.

As shown in FIG. 1, a monitored property 102 includes a control unit 104 that utilizes various components to monitor the monitored property 102. The various components within the monitored property 102 may include one or more speakers 108, one or more cameras 110, one or more lights 112, one or more sensors 114, and one or more home devices 116. The one or more cameras 108 may include video cameras that are located at the exterior of the monitored property 102, as well as video cameras located at the interior of the monitored property 102. For instance, video camera 135 may be located at the exterior of the monitored property 102 facing the backside of the monitored property 102. In another example, another video camera may be located outside the front door 120 of the monitored property 102. In another example, another video camera may be located at the interior of the monitored property 102 near the front door 120, facing the foyer. The one or more lights 112 may include lights around the monitored property 102 that can be used to light the monitored property 102 and provide notifications to individuals inside the monitored property 102. For example, lights that flash red can indicate a warning to individuals to leave the monitored property 102. In another example, lights that turn off can indicate to individuals in the monitored property 102 that one or more devices are not properly working.

The one or more sensors 114 can include a motion sensor located at the exterior of the monitored property 102, a front door sensor that is a contact sensor positioned at the front door 120, and a lock sensor that is positioned at the front door 120 and each window, such as window 118. The lock sensor can sense whether the front door 120 and window 118 are in an unlocked position or a locked position. The one or more home devices 116 can include home appliances such as a washer, a dryer, an oven, a dishwasher, a stove, a microwave, a television, a printer, a thermostat 122, and a laptop, to name a few examples. The security panel 166 may receive one or more messages from a corresponding control unit 104, a security server 132, and a client device 136 corresponding to the installer 138 of the monitored property 102. The one or more speakers 108 may include speakers around the monitored property 102 that can be used to play sounds at the monitored property 102 and provide auditory notifications to individuals inside the monitored property 102. The one or more speakers 108 can also include one or more microphones.

The control unit 104 communicates over a short-range wired or wireless connection over network 106 with connected devices such as each of the one or more speakers 108, one or more cameras 110, one or more lights 112, one or more sensors 114, one or more home devices 116 (e.g., washing machine, dryer, a dishwasher, an oven, a stove, a microwave, a laptop, printer, television, etc.), one or more speakers 114, drone 132, drone 144, a thermostat 122, and security panel 166 to receive sensor data descriptive of events detected by each of these devices in the monitored property 102. In some implementations, each of the connected devices may connect via Wi-Fi, Bluetooth, or any other protocol used to communicate over network 106 to the control unit 104. Additionally, the control unit 104 communicates over a long-range wired or wireless connection with a security server 132 over network 130 via one or more communication links. In some implementations, the security server 132 is located remote from the monitored property 102, and manages the monitoring at the monitored property 102, as well as other (and, perhaps, many more) monitoring systems located at different properties that are owned by different individuals. In other implementations, the security server 132 communicates bi-directionally with the control unit 104. Specifically, the security server 132 receives sensor data descriptive of events detected by the sensors included in the monitoring system of the monitored property 102 for particular events.

The security server 132 can also communicate with a firmware database 134 over the network 130 via one or more communication links. In some implementations, the control unit 104 can communicate with the firmware database 134 through the security server 132. The firmware database 134 includes a set of firmware corresponding to one or more devices found in the monitored property 102. Additionally, the firmware database 134 can include firmware corresponding to devices not found in the monitored property. The firmware database 134 can be stored on the internet or located in a third party base. The firmware for each device in the firmware database 134 can be updated on an interval basis to ensure each device has the most up-to-date firmware and/or software. In particular, the firmware database 134 can be devices and/or sensors that can connect via Wi-Fi, Bluetooth, Zigbee, or any other protocol to the control unit 104 and/or the security server 132. In some implementations, a user can indicate to the security server 132 which devices and/or sensors are included in the monitored property 102. In other implementations, the monitored property 102 can detect and identify, using the one or more cameras 110, the one or more lights 112, and one or more drones that may be monitoring the monitored property 102, one or more devices found in the monitored property 102. The identified devices can be reported to the security server 132 and stored in the firmware database 134. As new firmware is released from manufactures corresponding to the devices and/or sensors, the security server 132.

In some implementations, the firmware database 134 allows an entity to add or delete data from its database. In particular, a user, such as installer 138, can request for firmware for a particular device from the security server 132 that can access the data in the firmware database 134. The installer 138 can view a web interface, application, or device specific application for a smart home system to view the data in the firmware database 134. The client device 136 can be, for example, a desktop computer, a laptop computer, a tablet computer, a wearable computer, a cellular phone, a smart phone, a music player, an e-book reader, a navigation system, a security panel, or any other appropriate computing device. In some implementations, the client device 136 can communicate with the control unit 104 over network 106.

The network may be wired or wireless or combination of both and can include the Internet. The client device 136 can also communicate with the security server 132 and the firmware database 134 over the network 130.

In the example shown in FIG. 1, the installer 138 can install the control unit 104 on the monitored property 102 and can arm the monitored property 102 at any point in time with a signature profile set through a client device 136. In doing so, the installer 138 may set a profile to allow the speakers 108, cameras 110, lights 112, sensors 114, and home devices 116 along with the control unit 104 found on the monitored property 102 to survey the monitored property for unexpected activity. The installer 138 may interact with the client device 136 to activate a signature profile, such as "arming" for the monitored property 102. Alternatively, the installer 138 may set another signature profile, such as "adding new device," for when an installer 138 installs a new device in a monitored property 102 that is required to have new firmware installed from the firmware database 134.

In some implementations, installer 138 may communicate with the client device 136 to activate a signature profile for the monitored property 102. To illustrate, installer 138 may first instruct the control unit 104 to set a signature profile corresponding with arming the monitored property 102. By arming the monitored property 102, the monitored property 102 is prepared for and can detect any intrusions. Then, the installer 138 can use a voice command to set another profile, such as saying "Smart Home, adding new device," to the client device 136. The voice command can include a phrase, such as "Smart Home" to trigger the client device 136 to listen actively to the command following the phrase. Additionally, the phrase "Smart Home" may be a predefined user configured term to communicate with the client device 136. The client device 136 can send the voice command to the control unit 104 over the network 106 for additional processing. The installer 138 can set a profile without having to arm the property.

In some implementations, the control unit 104 can notify the security server 132 that the monitored property 102 is set to execute the arming signature profile. In addition, the control unit 104 can set parameters in response to receiving the voice command. Additionally, the control unit 104 can send back a confirmation to the client device 136 in response to arming the monitored property 102 and setting the associated parameters. For example, the control unit 104 may transmit a response to the client device 138 that reads "Smart Home, arming profile set."

In some implementations, in order for the control unit 104 to allow owner 138 and others to set and activate a signature profile case for the monitored property 102, the owner 138 and other may define and store signature profiles in the control unit 104. In other implementations, the owner 138 and other may define and store signature profiles in the security server 132 by instructing client device 136 to store the signature profiles in the security server 132. The signature profile may be associated with each property owner and allow for various use cases of the devices in the monitored property 102. Each of the signature profiles can be associated with one user, such as owner 138 or another owner. For example, an owner 138 may create a signature profile for arming the monitored property 102. In another example, the owner 138 can create a signature profile for adding data that indicates a new device has been added to the monitored property 102.

In some implementations, installer 138 may store one or more parameters associated with a use case in his or her signature profile. Specifically, the one or more parameters for each use case may describe an aperture amount for the cameras 110, a brightness intensity level and color for the lights 112, a sensitivity amount for each of the sensors 114, whether to turn on or off the selected home devices 116, such as the television, laptop, one or more fans in the monitored property 102, setting a specific temperature of the thermostat 122, opening or closing of the shades of window 118 by a particular amount, alarm settings corresponding to the monitored property 102, camera settings on drones, and any other parameters to describe the use case. The installer 138 may define a sensitivity of 4× the normal amount for the one or more sensors 108, an aperture amount of f/8 for the one or more cameras 110, zero lumens and a color of dim white for the one or more lights 112, turning on television, turning on a laptop, turning on fans, setting the thermostat 122 to 75 degrees Fahrenheit, opening the blinds halfway of the window 118, turning on the outdoor camera 135, and turning on notifications for the smart home application on the client device 138 indicating when new devices are detected in the monitored property 102.

In some implementations, the control unit 104 sets the parameters for the desired signature profile when the installer 138 speaks "Smart Home, set arming profile" to the client device 136. The control unit 104 saves the parameters in memory defined by the installer 138 in the smart home application on the client device 136 in response to the user setting the parameters. In addition, the control unit 104 may transmit the stored parameters for the signature profile to the security server 132 to save for backup purposes.

In some implementations, one or more speakers 108, cameras 110, lights 112, sensors 114, and home devices 116 may not be able to communicate with the control unit 104 or the security server 132. In particular, the control unit 104 and/or the security server 132 may require the use of a particular communication protocol or to communicate at speeds higher (or lower) than the communication speeds offered by the various devices found in the monitored property 102. Additionally, these devices found in the monitored property 102 may each require tedious processes to be able to communicate with and understand the communication protocols provided to and from the control unit 104 and the security server 132. In order to alleviate these inefficiencies, each device in the monitored property 102 can connect to a smart connection module.

As illustrated in system 100, a monitored property 102 can include one or more smart connection modules, such as a smart connection module 137. The smart connection module 102 can be a sensor-agnostic communication platform with various hardware and software modules for connecting to and monitoring devices found in the system 100. The smart connection module 102 can communicate with the control unit 104 and the security server 132 using a standardized and understood communication protocol. In some implementations, each smart connection module found in the monitored property 102 can communicate with one another. Likewise, each smart connection module can communicate with the client device 136 that includes a corresponding smart home application. In addition, the smart panel 164 found in the monitored property can communicate with its own smart connection module (e.g., smart connection module 156) as well as other smart connection modules connected to other devices found in the monitored property 102. The smart connection module can also provide secure communications between its connected device and the control unit 104 or the security server 132. In particular, any data generated by the device connected to the smart connection module can be securely communicated to the control unit 104 or the security server 132. For example, the smart connection module can communicate data using Bluetooth, WiFi, Cellular LTE, 4G LTE, Cellular 5G, any other type of cellular communication, and/or Z-Wave and in combination, use one or more encryption algorithms to communicate the data.

In some implementations, the smart connection module, such as smart connection module 137, can include a host board for the thermostat 122 and a core board. In other implementations, the smart connection module can also include one or more add-on boards. The core board can be mounted on top of the host board. In some implementations, the core board can be mounted underneath or on the side of the host board. The one or more add-on boards can be mounted on top of the core board. In some implementations, the one or more add-on boards can be mounted underneath or on the side of the core board. A host board can be a product specific board that can include any specific component required for the specific product. A host board can also translate product specific requirements and functions to a set of standardized communications and functions. For example, a host board can be a product specific host board for a garage controller, such as garage controller 162, or a thermostat 122, a smoke detector 124, light bulbs 128 and 129, door lock 121, a carbon dioxide monitor, a router, GPS tracker, flood/leak monitor, weather station, panic alarm, driveway monitor, or a car monitor. The host board can generate sensor data based on each of the specific product types. The host board can include various modules or components for each specific product type. For example, for the host board specific to the thermostat 122, that host board would include one or more buttons corresponding to the thermostat 122, one or more power components of the thermostat 122, such as the 9 v or 12 v battery supplies, power input/output, memory storage, communication protocols for the thermostat 122, and an adaptable connector for connecting to a core board. In some implementations, a host board can be custom built and designed by a product manufacturer. As a result, a host board can come in any shape and/or size.

A host board can include a memory, such as an EEPROM or flash that stores information about a particular host board. For example, the information can include unique serial information of the host board, data indicating the different modules included on the host board, data indicating the specific product type of the board, and a pin configuration based on the specific product type of the board. The host board includes an adaptable connector for connecting to a corresponding core board. For example, the adaptable connector can be a female connector of an M.2 connection, a PCI-Express connector. SATA connector, a USB 3.0 connector, or a 20 pin (2×10) header connector.

A core board can be a daughter card that connects to the host board. The core board can include one or more communication modules for communication with a client device, a control unit 104, and a security server 132. In particular, the core board can include cellular radio, a SIM card, a microcontroller, power circuits, and an antenna. The microcontroller can be an ARM Cortex M4 Processor that can be interfaced with an array of 75 pins broken out to an adaptable connector connected to the host board. The cellular radio can include 3GPP and LTE communications (such as 4G and 5G) to also communicate with a cellular tower using various cellular carriers, such as, for example, Verizon, AT&T, and SPRINT. Additionally, the core board can include an LTE CAT M1 radio allowing for low throughput for long-range communication. The core board can also include a Bluetooth 5.0 radio that provides a low power short-range communication option. For memory, the core board can also include flash memory, RAM, and an on board flash chip. In some examples, the core board can include 4 master/slave SPI, USB, GPIO, 5 two-wire interfaces (I²C), 4 UART connections, and a 12 bit ADC line. The size of the core board could be, for example, 20.15 mm×30 mm. In another example, the size of the core board could be 37 mm×47 mm.

The core board can connect to the host board through the host board's adaptable connector. In some implementations, the core board includes a male component of the adaptable connector and host board includes a female component of the adaptable connector. In other implementations, the core board includes a female component of the adaptable connector and the host board includes a male component of the adaptable connector. In particular, the adaptable connector acts as the interface between a core board and the host board. The adaptable connector can include a set number of pre-defined pins. For example, the adaptable connector can include 66 pre-defined pins. In another example, the adaptable connector can include 74 pins. 22 of the 66 pre-defined pins can include a multi-function purpose. For example, a multi-function purpose can include a UART, an SPI function, an I2C function, an A2D function, PWM function, clocks, and wakeup function. 21 of the sixty-six pre-defined pins can have a limited single function purpose. For example, the limited single function purpose can include SWD, USB, and Audio input/output. The remaining 23 pins can be used for power and ground purposes. For example, power and ground purposes can include 12V power supply, 9V power supply, 5V power supply, return line, and ground. In particular, these 23 pins can include 17 ground pins, 3 core input power pins ranging from 2.3V to 4.8V, and 2 cell input power pins ranging from 3.2V to 4.2V.

In some implementations, the core board connects to the host board and can adjust the functionality of the pin of the adaptable connector based on a specific type of the host board. In particular, in response to the core board connecting to the host board via the adaptable connector, the core board turns on. Turning on indicates that each of the components powers on. However, the pins of the adaptable connector remain in RESET mode until the core board can set the functionality for each of the pins. In particular, in response to the core board powering on the components, the core board transmits a request to the EEPROM of the host board. The request queries the EEPROM for an identifier of the host board. As previously mentioned the EEPROM of the host board can include, for example, unique serial information of the host board, data indicating the different modules included on the host board, data indicating the specific product type of the board, and a pin configuration based on the specific product type of the board. The core board can retrieve this information to set up the functionality of the adaptable connection between the host board and the core board. In other implementations, the core board cannot set the pin configuration until after it has received the firmware for the corresponding product specific host board. The firmware for the corresponding product specific host board can include the pin configuration for the product specific host board.

In some implementations, the core board uses the pin configuration received from the EEPROM of the host board (or retrieved from firmware) to set the pin functionalities of the adaptable connector. For example, for the thermostat 122 the core board can receive a pin configuration that instructs pins 1 through 4 can be UART, and pins 5 through 16 can be A/D conversion, pins 17 through 21 can be USB, pins 22 through 40 to be 12V power, pins 41 through 45 to be ground, and pins 46 through 60 can be unused. In another example, the pin configuration can be a completely different configuration for a different specific product host board.

In some implementations, after the core board configures the adaptable connector's pin configuration based on the specific product type of the host board, the core board can determine if it has the proper firmware to communicate with the product that exists on the product specific host board. The core board can determine if it has local access to firmware associated with the product existing on the product specific host board. For example, if the product is a thermostat, such as thermostat 122, on the host board, the core board can determine if it has the firmware to communicate with the thermostat 122. Communicating with the thermostat 122 requires the core board to have the correct communication protocols, understanding of the software and firmware used by the thermostat 122, and any corresponding hardware API calls made by the thermostat 122. The core board can access its own memory to determine if it has the proper firmware to communicate with the thermostat 122. If the core board does indeed have local access to the firmware for the thermostat 122, for example, the core board can use that firm to set pin configurations for the adaptable connector for communicating with the host board.

Additionally, the core board can communicate with the control unit 104 or with a third party database found in the monitored property 102. Alternatively, the core board can transmit a request to the control unit 104 to communicate with the security server 132 to retrieve firmware corresponding to the product specific host board if the core board does not have local access to firmware. In some implementations, the core board can also transmit a request to the control unit 104 to communicate with the security server 132 to determine if any updates to its current local firmware exists. The control unit 104 can transmit a notification to the client device 136 of the installer 138 indicating that firmware is required for a particular product for a corresponding product specific host board.

In some implementations, the security server 132 can push down firmware over network 130 to the control unit 104 each time a new update is found and stored in the firmware database 134 for a corresponding product specific host board. Thus, each time the core board connects to a product specific host board and determines the identifier of the product specific host board, the core board can transmit a request to the control unit 104 to determine if any updates have been provided for the firmware on the core board.

Once the core board receives the proper firmware for the corresponding product specific host board, the core board proceeds to initialize the host board. Initializing the host board includes communicating with each of the modules on the host board to determine if they are properly working. Additionally, this can include performing one or more tests on the modules and subsequently executing a desired functionality of the modules in response to the one or more tests successfully executing. In some implementations, the core board can send a notification to the control unit 104 indicating that the smart connection module is now configured to use for the product specific host board. In addition, the control unit 104 can transmit a notification to the client device 136 corresponding to the installer 138 indicating that the core board is now functioning properly with the product specific host board.

In some implementations, the smart connection module can transmit an indication to the control unit 104 if the core board still cannot properly communicate with the host board after receiving the most up to date firmware from the security server 132. The control unit 104 can transmit a notification to the client device 136 indicating that a problem exists with a particular smart connection module. The installer 138 can proceed to fix or replace the smart connection module. In response, the installer 138 can indicate on the client device 136 whether he/she fixed the issue with the smart connection module or replaced the smart connection module with another smart connection module.

In some implementations, a core board can be interchangeable with different product specific host boards. A core board can be a standardized platform that is utilized across different product specific host boards. For example, a user can connect a core board to a thermostat specific host board, configure the core board to communicate and execute the functions corresponding with the thermostat specific host board. Afterwards, the user can remove the same core board from the adaptable connector connecting to the thermostat specific host board, and connect the same core board to the smoke sensor specific host board. In response, the core board now connected to the smoke sensor specific host board performs the same functions for initializing as performed for when initializing thermostat specific host board. Thus, the standardized platform can be included on all product specific host boards with the adaptable connector.

In some implementations, a smart connection module or a smart board can include one or more additional add-on boards. The add-on boards allow pre-certified functional modules to be added to the core board without having to add them to the product specific host board. Thus, this allows for additional functionality to be used that does not come standard with the product specific host board. For example, the additional add-on boards can include functionality for a GPS module, additional WiFi and Bluetooth Low Energy (BLE), a 900 MHz protocol, and Z-Wave communication. Additionally, the add-on boards can include a standardized pin out for connecting with the core board. For example, this can include a PCI-Express layout, M.2 connection, or a USB 3.0 connection. The add-on boards can also have the functionality of SD Cards and CANBUS communications for various vehicular devices.

In some implementations, the smart board can act as a security system for the monitored property 102. In particular, if a monitored property 102 includes a smart board for each device, then the monitored property 102 can enable a decentralized security system, in which the smart boards can collectively work together to provide security alerts to an owner of the monitored property 102. Essentially, the security and monitoring provided by the monitored property 102's sensors, control unit 104, and the security server 132 can be replaced with the monitored property 102's sensors and corresponding smart boards. The smart boards can receive notifications from each sensor and determine from the received data whether it should provide an alert to the client device of the owner of the monitored property 102. In some implementations, the monitored property 102 may no longer require the security panel 164. Instead, the smart board, such as smart board 154, can include a monitor that displays a message when an alert is detected. The message can be displayed in a visual manner or an auditory manner. For example, if the smart board 140 connected to the smoke alarm 124 receives an indication from the smoke alarm 124 that smoke has been detected, the display can read "SMOKE DETECTED." In some implementations, the smart boards can communicate with one another in the monitored property 102. For example, smart board 140 can communicate with the other smart boards such that, if the smoke alarm 124 detects smoke and provides the indication to the smart board 140, the smart board 140 can transmit an indication to other smart boards to also display a message that recites "SMOKE DETECTED." By providing notifications to each smart board in the monitored property 102, the residents can be aware of any security alerts detected in the monitored property 102. In addition, this decentralized security system no longer has a central failure point. Thus, if any of the smart boards has a hardware or software failure, then the other smart boards can still leverage their corresponding sensors and communicate detected security alerts to the owner.

During stage (A), the smart connection module 137 includes a core board and a product specific host board for the thermostat 122. The installer 138 can connect the thermostat 122 specific host board using the adaptable connector to the core board of the smart connection module 137. In response to the core board connecting to the thermostat 122 specific host board, the core board can determine what the type of device is by requesting for an identifier of the device. As illustrated in system 100, the core board of the smart connection module 137 transmits a request 166 to the host board through the adaptable connector. The request 166 can include an indication for an identifier from the EEPROM of the host board. The EEPROM can be segmented into one or more partitions. The EEPROM can include, for example, unique serial information of the host board, data indicating the different modules included on the host board, data indicating the specific product type of the board, and a pin configuration based on the specific product type of the board.

During stage (B), the host board can transmit information 168 from its EEPROM to the core board across the adaptable connector. In some implementations, the host board can transmit information 168 across any of the pins in the adaptable connector. In other implementations, the host board only transmits information 168 across the multi-function and/or single function pins as the power and ground pins may only be required to power the core board and the host board and not be used to transmit any information. The information 168 can include any information necessary to provide the core board for initializing the corresponding smart connection module 137. In particular, this information can typically include the data indicating the specific product type of the board, the unique serial information of the host board, and the pin configuration based on the specific product type of the board. Additionally, the data indicating the different modules included on the host board can be requested for by the control unit 104 or the client device 136 in response to debugging an issue with the product specific host board.

In response to receiving the information 168 from the host board, the core board can use the information 168 to determine a type of the product specific host board. For example, the unique serial information of the host board can be used as the identifier for the core board. The core board can use the unique serial information to determine if a core board has access to local firmware corresponding to the unique serial information. For example, the core board can transmit a request to the control unit 104 requesting for local firmware. In another example, the core board can check its own memory or an add-on on top of the smart connection module 137 to determine if local firmware exists for the corresponding product specific host board.

During stage (C), in response to the core board determining that it does not have access to local firmware for the product specific host board, the core board can transmit a request 170 to the control unit 104 to request for the most up to date firmware for the corresponding product specific host board from the security server 132. The request 170 can include the unique serial information and data indicating to the control unit 104 to transmit a request to the security server 132 for firmware updates. The core board can transmit the request 170 to the control unit 104 using one or the communication protocols on the core board or on the add-on of the core board. For example, the communication protocols can be WiFi, Bluetooth, Cellular, or Z-Wave, to name a few examples.

During stage (D), the control unit 104 receives the request 170 and determines from the request the smart connection module 137 is requesting for updated firmware from the security server 132. The control unit 104 formulates a request 172 that includes the unique serial information of the product specific host board from the smart connection module 137 and data identifying the control unit 104. The data identifying the control unit 104 can include an IP address, a mac address, a router address connected to the control unit 104, or a data identifier corresponding to the control unit 104. In response, the control unit 104 transmits the request 172 over the network 130 to the security server 132.

During stage (E), the security server 132 receives the request 172 from the control unit 104. In response to receiving the request 172 from the control unit 104, the security server 132 retrieves the unique serial information of the product specific host board from the request 172. The security server 132 uses the unique serial information of the product specific host board as an index to access corresponding firmware in the firmware database 134. The firmware database 134 includes a set of firmware corresponding to one or more devices found in the monitored property 102. The firmware database 134 also includes a set of firmware corresponding to one or more other devices not found in the monitored property 102, such that, if the installer 138 were to add a new device to the monitored property 102, the control unit 104 could transmit a request to the security server 132 for retrieving the firmware corresponding to the newly added device. Additionally, the firmware database 134 includes functionality to update versions of the firmware corresponding to the one or more devices. In some implementations, the firmware database 134's firmware can be indexed by unique serial information corresponding to products. In other implementations, the firmware database 134's firmware can be indexed by an identifier corresponding to a make and model of the product found on the product specific host board. For example, the firmware database 134 can include an identifier titled "Q-SMART THERMOSTAT" and include corresponding firmware or versions of the firmware for the Q-SMART THERMOSTAT.

During stage (F), the control unit 104 can transmit a notification 178 to the client device 136 indicating that firmware has been requested for the thermostat 122. The installer 138 can indicate whether he or she wishes to continue receiving status notifications for the particular smart connection module 137. Additionally, the installer 138 can request for an indication on the client device 136 when the smart connection module 137 is finished initializing with its firmware. The client device 136 can transmit this notification to the control unit 104 such that the control unit 104 knows to alert the client device 136 in response to receiving an indication from the smart connection module 137 that it finished initializing. In other implementations, the thermostat 122 can display a message that states "CONFIGURATION COMPLETE." In other implementations, the thermostat 122 can transmit a notification to the control unit 104 that provides a notification to the panel 164 that states "CONFIGURATION FOR THERMOSTAT COMPLETE."

During stage (G), in response to the security server 132 retrieving the most up to date firmware 174 from the firmware database 134, the security server 132 generates data 175 to transmit to the control unit 104. The data 175 includes the unique serial information of the product specific host board, the firmware 174 retrieved from the firmware database 134, and data identifying the control unit 104. The security server 132 uses the data identifying the control unit 104 as the destination to transmit the data 175 over the network 130. The security server 132 transmits the data 175 over the network 130 to the control unit 104.

During stage (H), the control unit 104 receives the data 175 from the security server 132 and determines which smart connection module should receive the firmware in the monitored property 102. In particular, the control unit 104 parses the data 175 to retrieve the unique serial information and corresponding firmware 174. The control unit 104 then generates data 176 that includes the unique serial information, corresponding firmware 174, and data identifying the smart connection module 137 to provide to the smart connection module 137. The control unit 104 transmits the data 176 over the network 106 using one or more communication protocols, such as WiFi, Bluetooth, or cellular, for example.

In response to the smart connection module 137 receiving the data 176, the smart connection module 137 retrieves the firmware 174 and loads the firmware into its core board. In particular, the core board stores the firmware in its memory for use. In response to loading the firmware into the core board, the core board can run one or more tests to determine if the core board now works with the host board. Once the one or more tests are executed successfully, the smart connection module 137 can provide an indication to the control unit 104 that indicates the smart connection module 137 is ready for practical use. In addition, the control unit 104 can transmit a notification to the client device 136 indicating that smart connection module 137 is ready for practical use.

The operations of stages (A) to (H) illustrate one or more iterations of connecting one or more devices to communicate with smart connection modules. The control unit 104 can repeat the operations of (A) to (H) for many other iterations. In some implementations, the control unit 104 may perform the operations illustrated in FIG. 1 simultaneously for various smart connection modules. Additionally, the control unit may determine the operations illustrated in FIG. 1 for other devices in the monitored property 102, such as the smoke sensor 124, the garage controller 162, the main panel 164, and the light bulbs 128 and 129.

Figure 2:
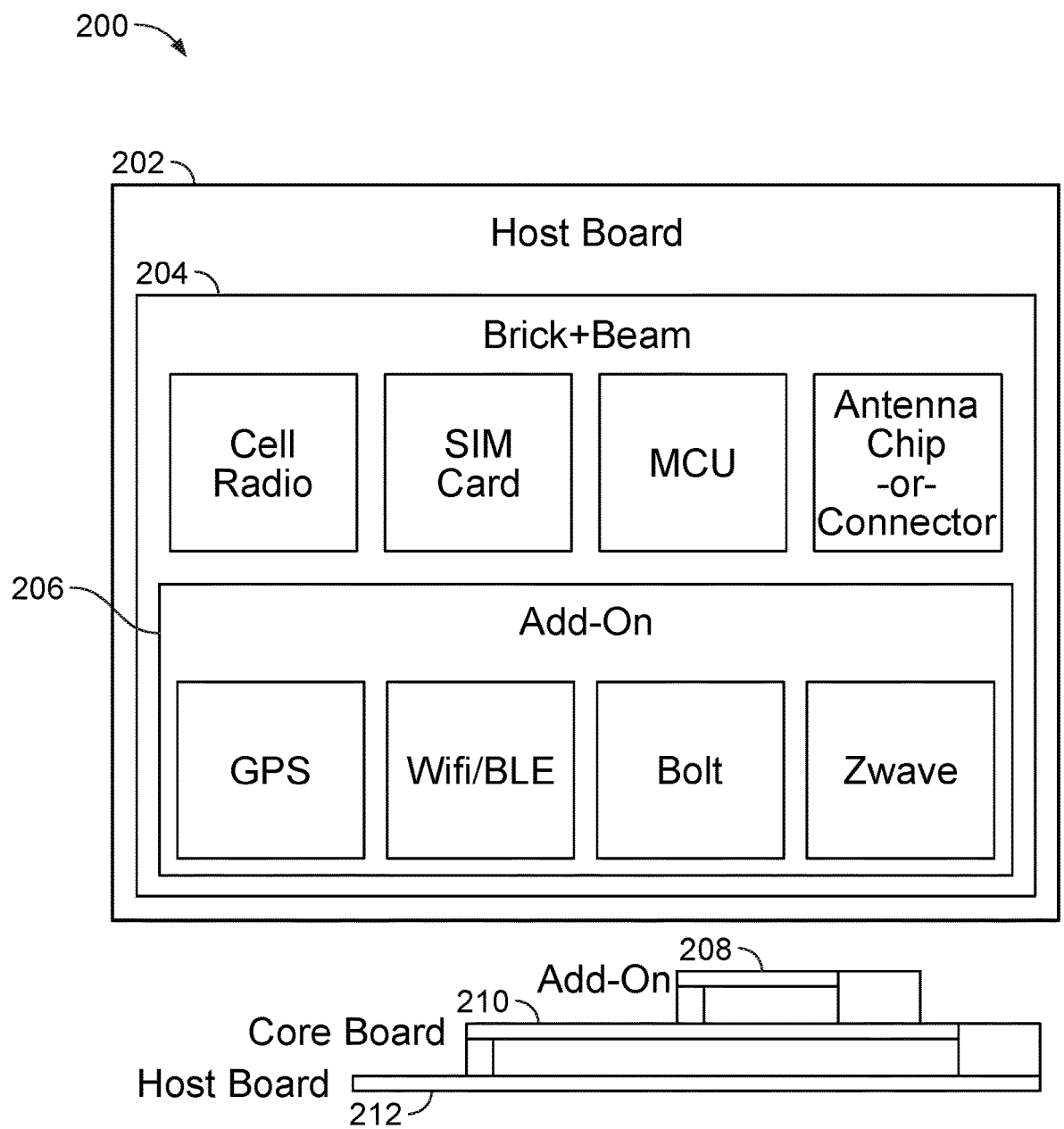
FIG. 2 is a contextual diagram of an example smart connection module.

FIG. 2 is a contextual diagram of a smart connection module 200. As illustrated in FIG. 2, the smart connection module 200 includes a host board 202, a core board 204, and one or more add-on boards 206. The host board 202 connects to the core board 204 through an adaptable connector. The adaptable connector can include 66 pre-defined pins, for example. Other number of pins can be used for the adaptable connector. The one or more add-on boards 206 can connect to the core board 204 of the smart connection module 202. The connections between the core board 204 and the one or more add-on boards 206 can be through a standardized connector. For example, the standardized connector can include 9 pins, 3 for ground and power and 6 for the functions included in the add-on board 206. In one example, the standardized connector can be a 12 pin connector with a 2×6 layout that includes 4 ground pins, 2 power pins, 2 programming pins, and 8 multi-use pins ($I^2S$, UART, $I^2C$, GPIO, A/D, etc.).

As illustrated in system 200, the add-on board 208 is mounted on top of the core board 210. Additionally, the core board 210 is mounted on top of the host board 212. The host board 212 can include a keyed PCB edge connector. The keyed PCB card edge connector can be for example, an M.2 Mini connector. The keyed PCB edge connector can include traces of etched contacts that lead to the edge of the core board 210 and are intended to plug into a matching socket. In some implementations, the height of the smart connection module 202 can range in size between 0.61 and 4.14 mm.

Figure 3:
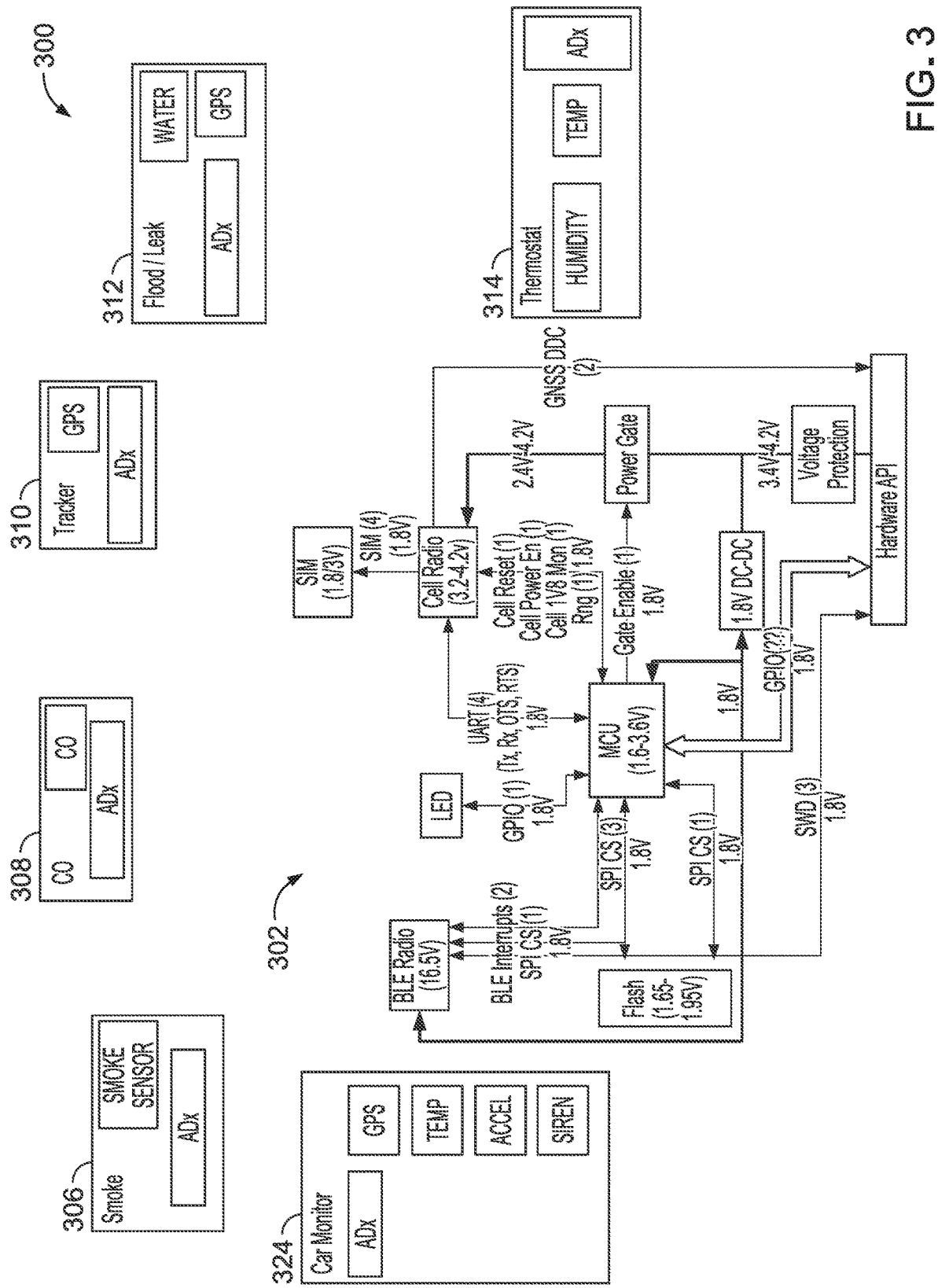
FIG. 3 is a contextual diagram of a core module and various host modules for an example smart connection module.
Figure 3:
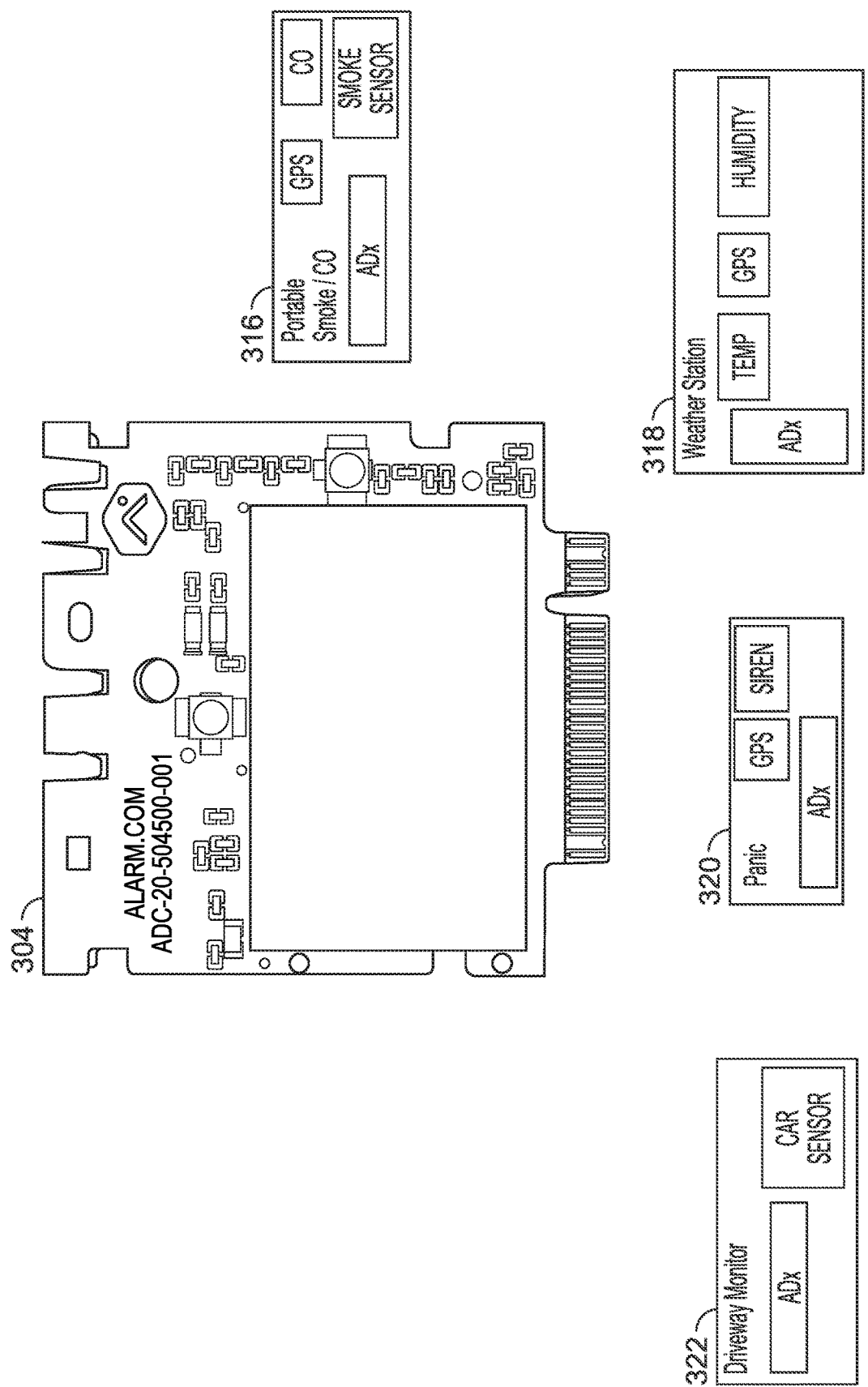

FIG. 3 is a contextual diagram of a core module and various host modules for a smart connection module. As illustrated in FIG. 3, system 300 illustrates a core board 304 and a corresponding circuit representation 302 of the core board 304. Additionally, the core board 304 can be integrated into a variety of product specific host boards, which decreases the time-to-market and certification costs for new products that require cellular connectivity. The core board 304 can connect with the one or more host boards provided in system 300. For example, the core board 304 can connect with a smoke sensor specific host board 306, a carbon monoxide host board 308, a GPS tracker host board 310, a flood/water host board 312, a thermostat host board 314, a portable smoke and carbon monoxide detector host board 316, a weather station host board 318, a panic host board 320, a driveway host board 322, and a car monitor 324. Each host board includes an adaptable connector, shown as an "ADx" connector in FIG. 3.

In some implementations, each host board includes one or more modules pertinent to the specific function of the host board. For example, the car monitor host board 324 includes a GPS sensor, a temperature sensor, an accelerometer, and a siren sensor. The car monitor host board 324 can translate the data from each of these sensors into a standardized data form and provide across the adaptable connector to the core board 304. In another example, the thermostat host board 314 includes a humidity sensor and a temperature sensor, among other components. In another example, the weather station host board 318 can include a temperature sensor, a GPS sensor, and a humidity sensor, among other components. In some implementations, once the core board connects to the host board, the core board can communicate with the adaptable connector to receive data from each of the various modules. Alternatively, the core board can communicate with each of the modules on the host boards to receive data.

Figure 4:
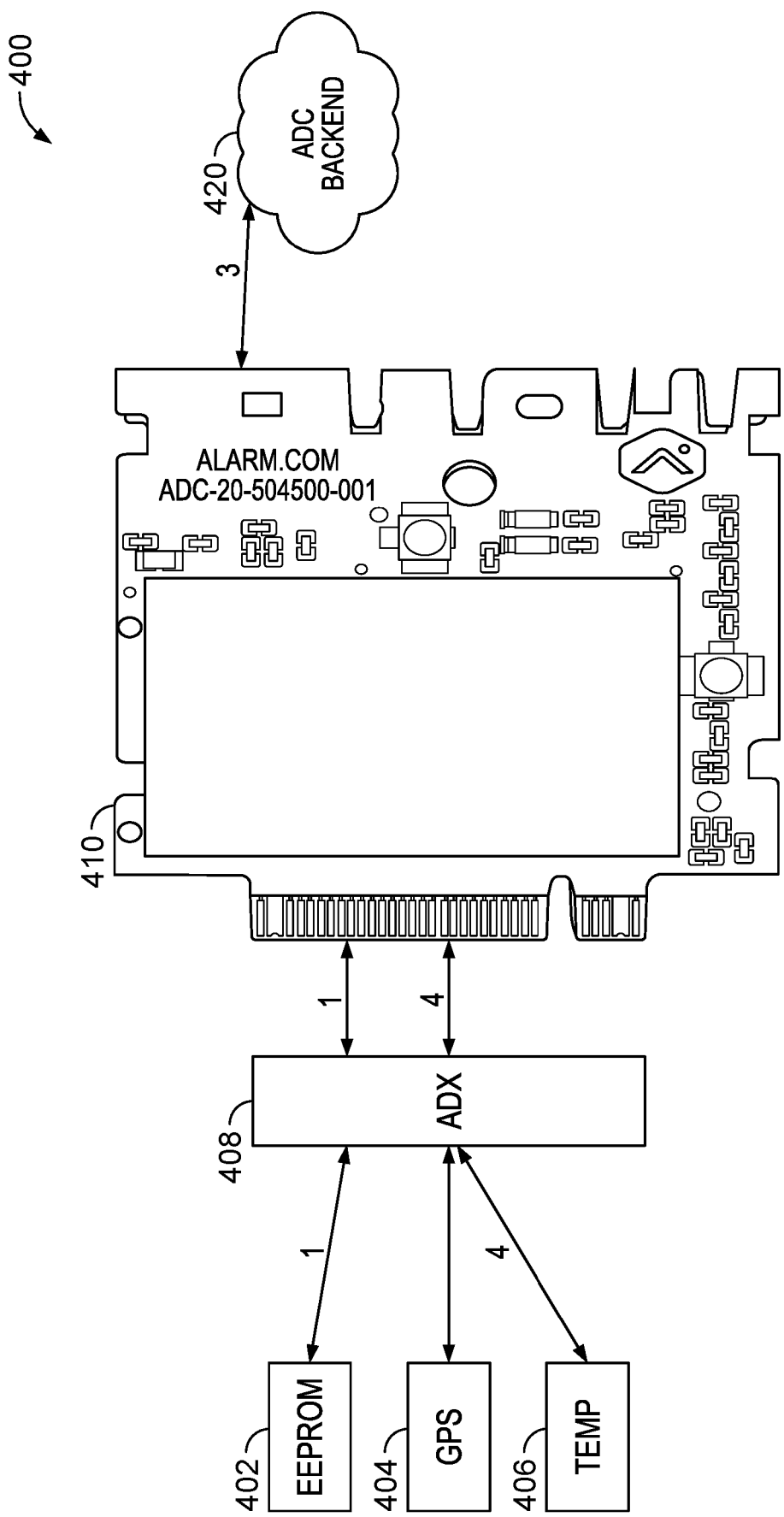
FIG. 4 is a contextual diagram for configuring an example core module associated with a backend system with an example host module.

FIG. 4 is a contextual diagram 400 for setting up a core module associated with a backend system with a host module. The diagram 400 illustrates the various components of a smart connection module that includes one or more modules of a host board, an adaptable connector 408, a core board 410, and a backend system 420. The one or more modules of the host board includes an EEPROM 402, a GPS sensor 404, and a temperature module 306. The numbers 1 through 4 illustrate the various steps of powering on and configuring the smart connection module shown in the diagram 400.

As illustrated in the diagram 400, when the core board 410 first powers on, the core board queries the EEPROM 402 of the host board through the adaptable connector 408 (1). The core board 410 queries the EEPROM 402 of the host board for necessary configuration data corresponding to the host board. In particular, the necessary configuration data can include unique serial information of the host board, data indicating the different modules included on the host board, data indicating the specific product type of the board, and a pin configuration based on the specific product type of the board. Based on receiving the necessary configuration data corresponding to the host board, the core board 410 configures the multi-function and the single-function pins of the adaptable connector 408 (2). The core board 410 configures the multi-function and the single-function pins of the adaptable connector 408 to set the various functions of the pins in order for the core board 410 to properly communicate with the host board. Additionally, the core board 410 determines if it has local access to firmware corresponding to the product specific host board.

If the core board 410 determines that it does not have local access to firmware corresponding to the product specific host board, then the core board 410 transmits a request to the backend 420 for the most up to date firmware corresponding to the product specific host board (3). The core board 410 includes the unique serial information of the host board in the request transmitted to the backend 420 in order for the backend to correctly retrieve the firmware corresponding to the host board. In response to the core board 410 receiving the firmware corresponding to the host board from the backend 420, the core board 410 executes the firmware and proceeds with initializing the host board.

Figure 5:
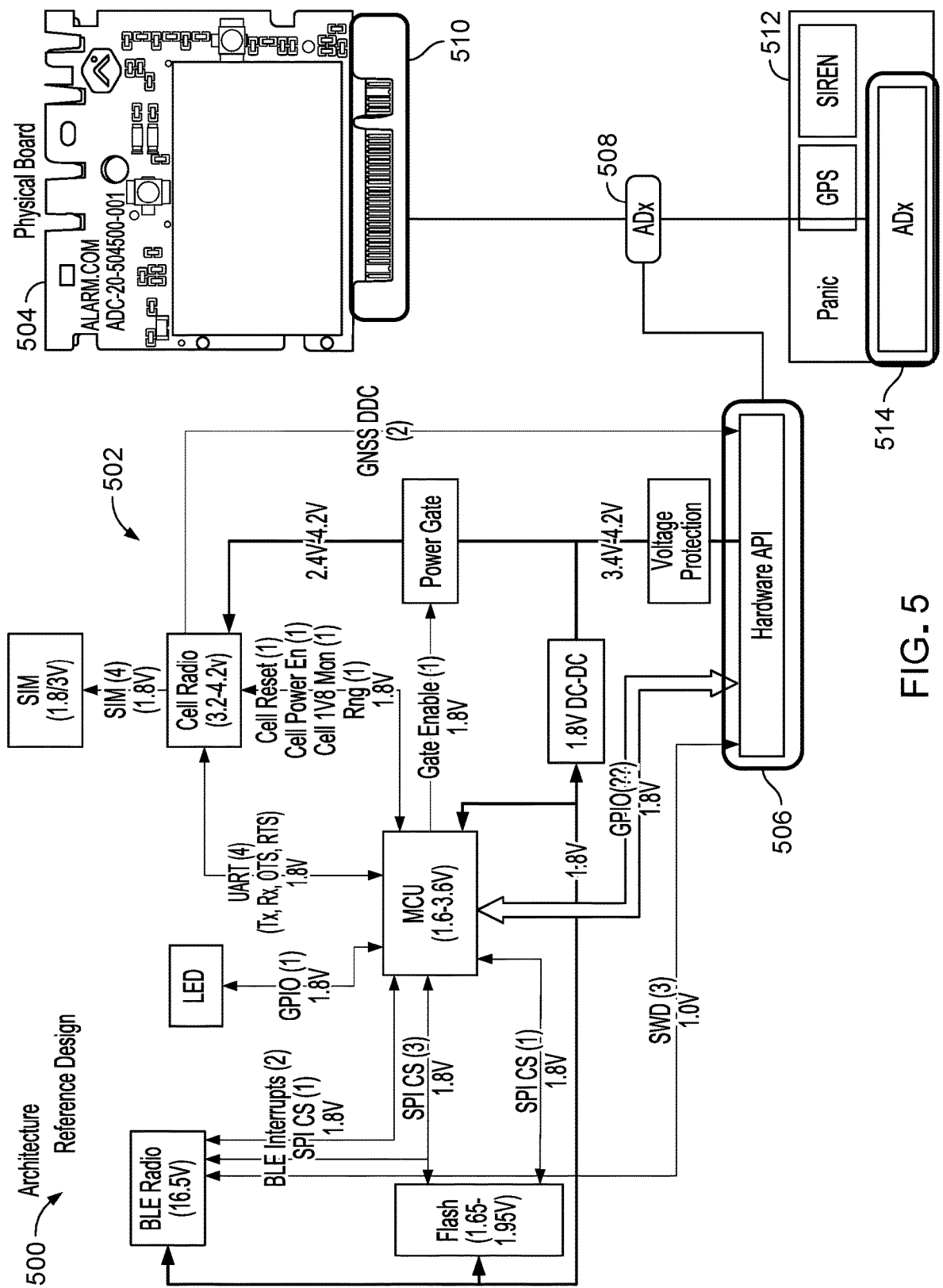
FIG. 5 is a contextual diagram for an example connection point between a host module and core module.

FIG. 5 is a contextual diagram 500 for a connection point between a host module and core module. The diagram 500 includes illustrations for the various components of a smart connection module that includes host board 512, an adaptable connector 514 of the host board 512, a core board 504, and a circuit representation of the core board 502. The circuit representation of the core board 502 includes a hardware API connector 506. The hardware API connector 506 can include one or more software, subroutines, or firmware components used to communicate with the pins 510, as shown on the core board 504. The pins 510 of the core board 510 connect with the adaptable connector 514 of the host board 512. The adaptable connector 514 can be, for example, a PCI-Express connector, a SATA connector, or a USB 3.0 connector.

In some implementations, the diagram 500 illustrates that the ADX corresponding to the circuit representation of the core board 502 and the ADX corresponding to the physical layout of the core board 504 are similar. Thus, should the functionality of the core board 504 and the host board 512 be combined to a single printed circuit board, as long as the ADX was included in the newly designed single printed circuit board, then the newly single printed circuit board would work as if the core board and the host board were separate boards connected through the ADX. In particular, the firmware and the features provided by the EEPROM of the host board would work as soon as the newly single printed circuit board was powered on.

Figure 6:
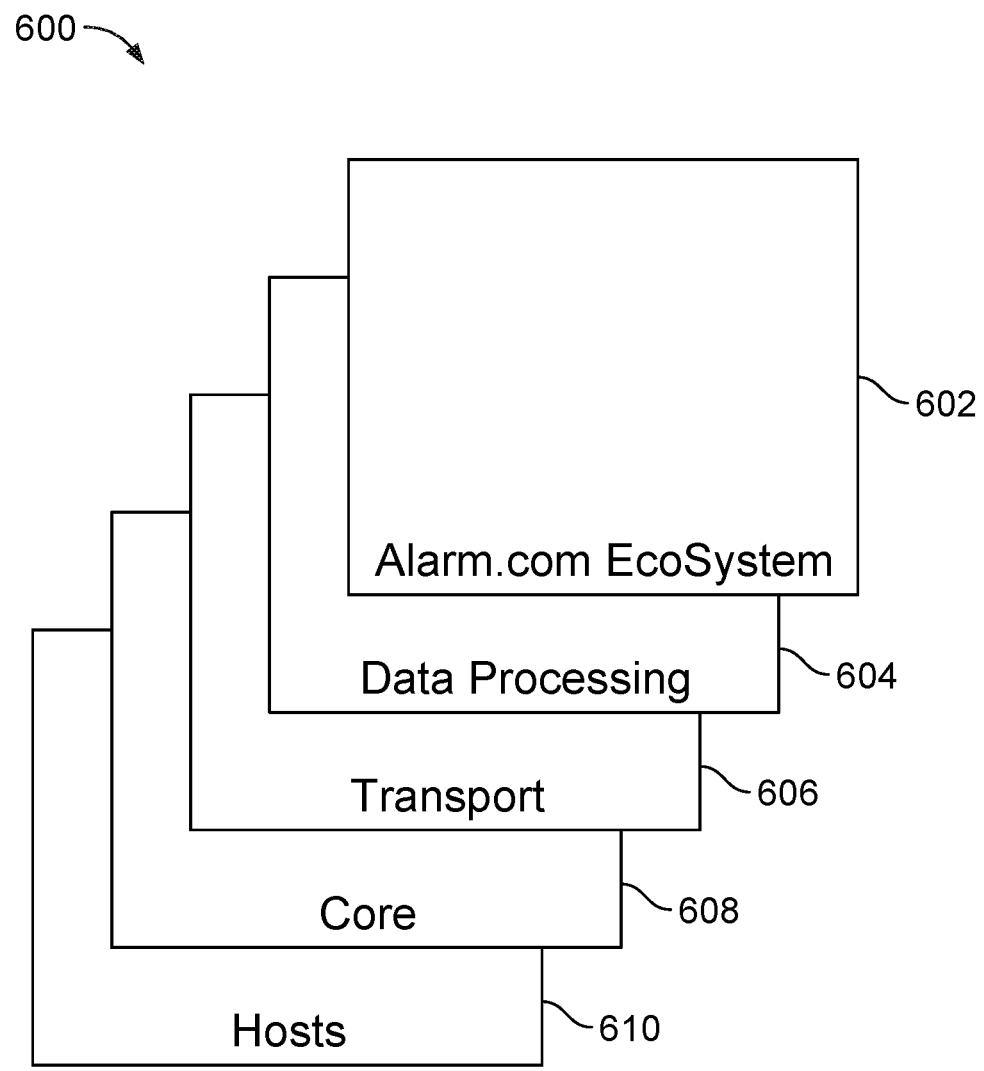
FIG. 6 is a contextual diagram for an example modular architecture of the smart connection system.

FIG. 6 is a contextual diagram for a modular architecture 600 of the smart connection system. The modular architecture 600 illustrates various components of software, firmware, and subroutine included in a smart connection system. The smart connection system can include the smart connection module and one or more components of the monitored property, such as that shown in system 100. In particular, the modular architecture 600 can include a monitoring system company ecosystem 602, data processing layer 604, transport layer 606, core layer 608, and hosts layer 610. Each of these components work in time to execute the software, firmware, and the subroutine functionality of the smart connection module. The monitoring system company ecosystem 602 can include a system for communicating with the core and host board, such as system 100 shown in FIG. 1. The data processing layer 604 can include all the processing performed by the front end and back end, such as the control unit 104 and the security server 132. The transport layer 606 can include one or more protocols and/or mechanisms for communication between the host/core board and the front end and back end. For example, the transport layer 606 can include protocols such as Bluetooth, WiFi, LTE Cellular, and other types of cellular communications. The core layer 608 can include functionalities corresponding to the core board and the hosts layer 610 can include functionalities corresponding to the host board.

In some implementations, the modular architecture 600 is responsible for executing functions of the smart connection system. The functions can include bootloader functionality of the smart connection module, functionality to configure the pin configuration of the adaptable connector, ability to communicate with the backend or the security server 132, detect and identify new modules attached to the host board, and receive one or more updates to the core board itself. Additionally, the modular architecture 600 is responsible a set of rules engine integration, configuring power profiles for each of the boards in a particular smart connection module; device configuration management; performing debugging and logging; flexible sensor data conditioning and messaging; SMS wakeup scheme; and, true dual path communication. In the power profile configuration, the modular architecture 600 is responsible for each host board having known ways of being powered. For example, a smoke sensor host board can include a 120 volts power supply, a rechargeable battery, or solar batteries. Additionally, based on the host board and its current power source, the core board can configure each of the power settings for the smart connection module. For example, this can include sleep schedules of the host board, radio usage, and backend check-ins for firmware updates. Additionally, to improve power consumption and efficiency, the core board can transfer sensor data calculations or other heavy processing from the host board to the back end to perform the heavy processing calculations. In some implementations, based on the remaining power in the batteries of the host board, the core board can transmit calculations to be performed by the backend in the ecosystem 602 if the remaining power is less than a threshold amount.

In the SMS wakeup scheme, the modular architecture 600 can include a reduced power mode to save power in the smart connection module. In some implementations, the reduced power mode can include two modes, power save mode (PSM) and extended Discontinuous Reception (eDRX). During the reduced power mode, a radio corresponding to the core board is registered with the LTE network, but the radio does not transmit or receive data. Periodically, the smart connection module comes of out of this reduced power mode to check whether the network has any pending SMS messages. In particular, SMS messages are quickly delivered to the modular architecture 600 and allowing the device to save power from excessive calls to the backend or returning to the reduced power mode if no action is required.

In the true dual path communication, if a core board has more than one communication path enabled, such as, for example, an LTE connection to an antenna and a WiFi connection to a control unit 104, the core board can treat each communication path as a weighted decision for transmitting data based on one or more factors. The one or more factors can include power consumption, available power source, estimate time to connect to the back end, last time the core board connected to the back, and last time each communication path was available. For example, since a core board would have two communication protocols, such as a cellular LTE radio and a local Bluetooth radio, the core board can determine which communication protocol to communicate. Cellular LTE can be available more often than local Bluetooth radio, but consumes more power and could take a relatively longer time to connect to the backend. The local Bluetooth radio would be dependent on the phone or control unit 104 being within proximity to the core board, but would be transmitted with lower power and relatively in quick fashion.

Figure 7:
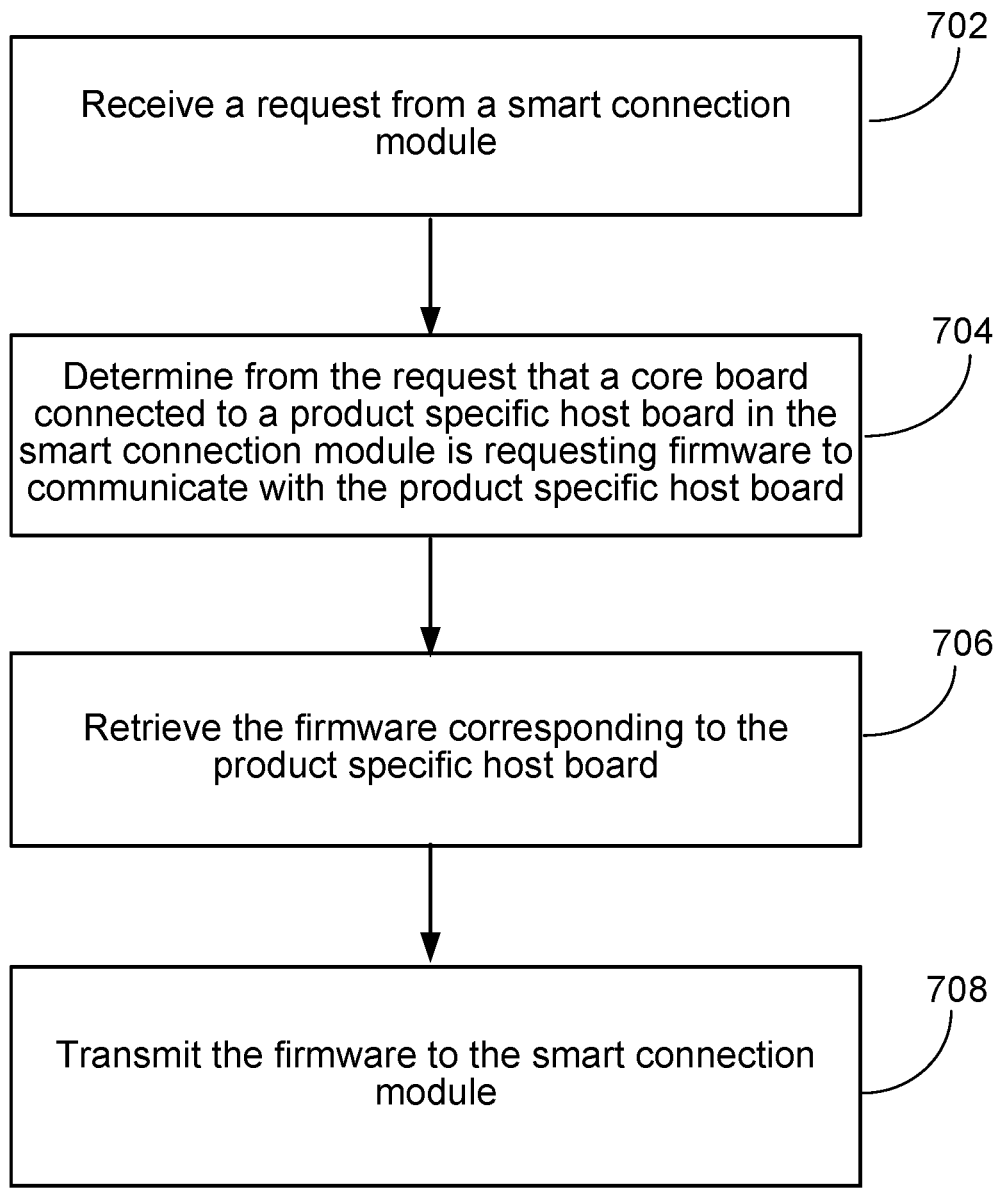
FIG. 7 is a flowchart of an example process for providing firmware for a core board connected to a product specific host board of a smart connection module.

FIG. 7 is a flowchart 700 of an example process for providing firmware for a core board connected to a product specific host board of a smart connection module. Generally, the process 700 includes receiving a request from a smart connection module; determining from the request that a core board connected to a product specific host board in the smart connection module is requesting firmware to communicate with the product specific host board; retrieving the firmware corresponding to the product specific host board; and, transmitting the firmware to the smart connection module. Alternatively, the process 700 can be used for providing firmware updates for a product specific host board to the smart connection module. The process 700 will be described as being performed by a computer system comprising one or more computers, for example, the system 100, such as the control unit 104 or the security server 132, as shown in FIG. 1.

During 702, a security server 132 receives a request from a smart connection module 137. In particular, the control unit 104 provides a request, such as request 172, that includes the unique serial information of the product specific host board from the smart connection module 137 and data identifying the control unit 104 to the security server 132. In some implementations, the unique serial information identifies the make and model of the device. The data identifying the control unit 104 can include an IP address, a mac address, a router address connected to the control unit 104, or a data identifier corresponding to the control unit 104.

During 704, the security server 132 determines from that request that a core board connected to a product specific host board in the smart connection module is requesting firmware to communicate with the product specific host board. In response to receiving the request 172, the security server 132 parses the request to retrieve the unique serial information of the product specific host board. The security server 132 can determine by parsing the request for the unique serial information of the product specific host board that the smart connection module is requesting for firmware to allow the core board and the product specific host board to communicate.

During 706, the security server 132 retrieves the firmware corresponding to the product specific host board. The security server 132 uses the unique serial information of the product specific host board as an index to access corresponding firmware in the firmware database 134. The firmware database 134 includes a set of firmware corresponding to one or more devices found in the monitored property 102.

During 708, the security server 132 transmits the firmware to the smart connection module. In response to the security server 132 retrieving the most up to date firmware 174 from the firmware database 134, the security server 132 generates data 175 to transmit to the control unit 104. The data 175 includes the unique serial information of the product specific host board, the firmware 174 retrieved from the firmware database 134, and data identifying the control unit 104. The security server 132 transmits the data 175 over the network 130 to the control unit 104.

Figure 8:
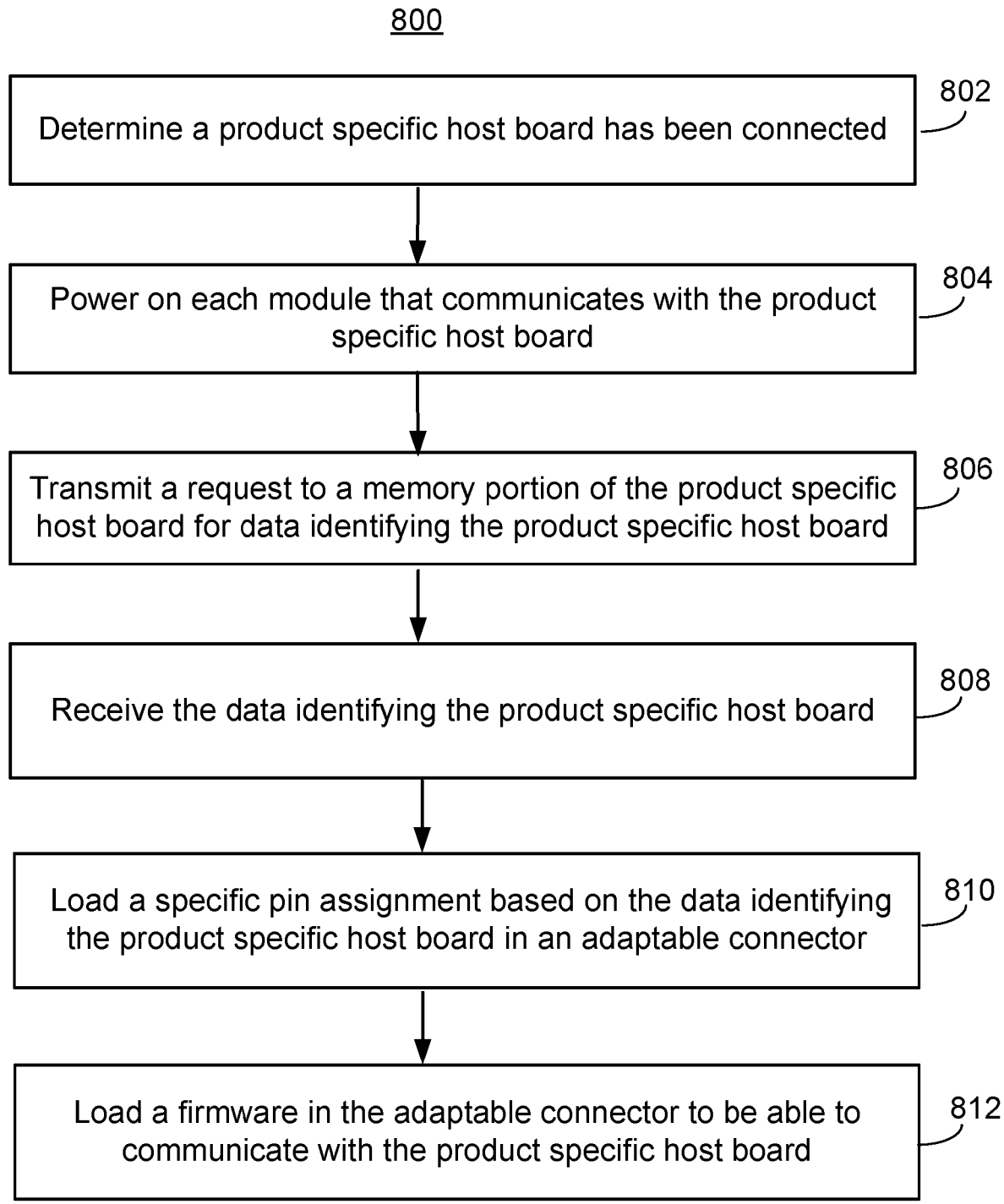
FIG. 8 is a flowchart of an example process for generating a pin assignment between a product specific host board and a core board of a smart connection module.

FIG. 8 is a flowchart 800 of an example process for generating a pin assignment between a product specific host board and a core board of a smart connection module. Generally, the process 800 includes determining a product specific host board has been connected; powering on each module that communicates with the product specific host board; transmitting a request to a memory portion of the product specific host board for an identifier of the product specific host board; receiving the identifier and pin assignments of the product specific host board; based on the identifier, selecting the appropriate firmware and checking the pin assignments for validity; and, loading the firmware and configuring the pin assignment in the adaptable connector to be able to communicate with the product specific host board. Alternatively, the process 800 can be used for retrieving the firmware or the pin assignments from a security server 132 for a corresponding product specific host board. The process 800 will be described as being performed by a computer system comprising one or more computers, for example, the core board of the smart connection module 137, as shown in FIG. 1.

During 802, a core board determines a product specific host board has been connected. An installer 138 can connect a product specific host board, such as a garage control specific host board, using an adaptable connector to the core board of the smart connection module. The core board can determine that it has been connected to a device and initiate a power on sequence.

During 804, the core board powers on each module that communicates with the product specific host board. In particular, in response to the core board connecting to the product specific host board via the adaptable connector, the core board turns on. Turning on indicates that each of the components of the core board powers on. However, the pins of the adaptable connector remain in RESET mode until the core board can set the functionality for each of the pins.

During 806, the core board transmits a request to a memory portion of the product specific host board for data identifying the product specific host board. The core board can determine what the type of device is by requesting for the data identifying the device. The core board transmits a request to the host board through the adaptable connector. The host board receives the request, processes the request by providing the information in its EEPROM related to allowing the core board to initializing the host board and the corresponding smart connection module. In particular, this information can typically include the data indicating the specific product type of the board, the unique serial information of the host board, and/or the pin configuration based on the specific product type of the board. The data can also include last known operating states of the host board in case it lost power, a record of the last known cellular strength of the host board or the core board, an indication of the last core board it was plugged in to, and calibration data required for allowing the modules on the host board to properly function.

During 808, the core board receives the data identifying the product specific host board. In some implementations, the host board can transmit the identifier information from its EEPROM to the core board across the adaptable connector. The data identifying the product specific host board can include data from the EEPROM and unique identifier information found in the EEPROM. The data from the EEPROM can include, for example, pin configuration information and the unique identifier information can include a MAC address and other identification information of the product specific host board. The host board transmits this information across the multi-function and/or single function pins. The information can allow the core board to initialize the host board.

During 810, the core board loads a specific pin assignment based on the data identifying the product specific host board in an adaptable connector. For example, the pin configuration retrieved from the EEPROM can indicate that the adaptable connector's pins be set in the following manner: pins 1 through 15 can be SPIO, pins 16 through 22 can be A/D conversion, pins 23 through 44 can be USB, pins 44 through 60 to be 12V power, and pins 61 through 66 to be ground. In some implementations, the pin configuration can include a different configuration for a different product specific host board.

During 812, the core board loads the firmware to be able to communicate with the product specific host board. In response to receiving the data identifying the product specific host board, the core board can use the data identifying the product specific host board to determine a type of the product specific host board. For example, the unique serial information of the host board can be used as the identifier for the core board. The core board can use the unique serial information to determine if a core board has access to local firmware corresponding to the unique serial information. For example, the core board can transmit a request to the control unit 104 requesting for local firmware. In another example, the core board can check its own memory or an add-on on top of the smart connection module to determine if local firmware exists for the corresponding product specific host board. Once the core board properly retrieves the firmware, the core board can communicate with and perform functionality corresponding to the product specific host board.

Figure 9:
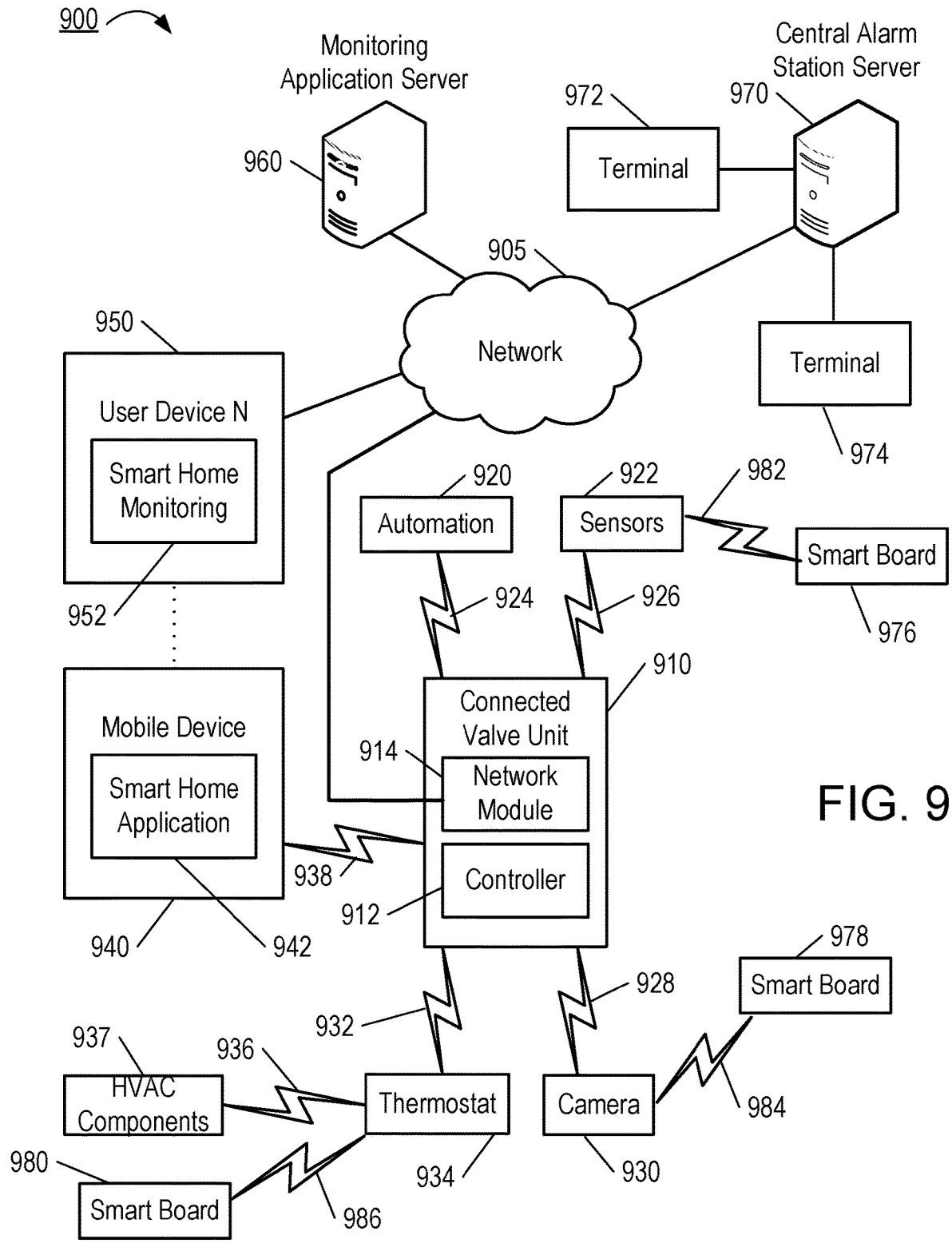
FIG. 9 is block diagram of an example monitoring system using a smart connection module.

FIG. 9 is a block diagram of an example monitoring system 900 using a smart connection module. The monitoring system 900 includes a network 905, a control unit 910, one or more user devices 940 and 950, a monitoring application server 960, and a central alarm station server 970. In some examples, the network 905 facilitates communications between the control unit 910, the one or more user devices 940 and 950, the monitoring application server 960, and the central alarm station server 970.

The network 905 is configured to enable exchange of electronic communications between devices connected to the network 905. For example, the network 905 may be configured to enable exchange of electronic communications between the control unit 910, the one or more user devices 940 and 950, the monitoring application server 960, and the central alarm station server 970. The network 905 may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data. Network 905 may include multiple networks or subnetworks, each of which may include, for example, a wired or wireless data pathway. The network 905 may include a circuit-switched network, a packet-switched data network, or any other network able to carry electronic communications (e.g., data or voice communications). For example, the network 905 may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network 905 may include one or more networks that include wireless data channels and wireless voice channels. The network 905 may be a wireless network, a broadband network, or a combination of networks including a wireless network and a broadband network.

The control unit 910 includes a controller 912 and a network module 914. The controller 912 is configured to control a control unit monitoring system (e.g., a control unit system) that includes the control unit 910. In some examples, the controller 912 may include a processor or other control circuitry configured to execute instructions of a program that controls operation of a control unit system. In these examples, the controller 912 may be configured to receive input from sensors, flow meters, or other devices included in the control unit system and control operations of devices included in the household (e.g., speakers, lights, doors, etc.). For example, the controller 912 may be configured to control operation of the network module 914 included in the control unit 910.

The network module 914 is a communication device configured to exchange communications over the network 905. The network module 914 may be a wireless communication module configured to exchange wireless communications over the network 905. For example, the network module 914 may be a wireless communication device configured to exchange communications over a wireless data channel and a wireless voice channel. In this example, the network module 914 may transmit alarm data over a wireless data channel and establish a two-way voice communication session over a wireless voice channel. The wireless communication device may include one or more of a LTE module, a GSM module, a radio modem, cellular transmission module, or any type of module configured to exchange communications in one of the following formats: LTE, GSM or GPRS, CDMA, EDGE or EGPRS, EV-DO or EVDO, UMTS, or IP.

The network module 914 also may be a wired communication module configured to exchange communications over the network 905 using a wired connection. For instance, the network module 914 may be a modem, a network interface card, or another type of network interface device. The network module 914 may be an Ethernet network card configured to enable the control unit 910 to communicate over a local area network and/or the Internet. The network module 914 also may be a voiceband modem configured to enable the alarm panel to communicate over the telephone lines of Plain Old Telephone Systems (POTS).

The control unit system that includes the control unit 910 includes one or more sensors. For example, the monitoring system may include multiple sensors 920. The sensors 920 may include a lock sensor, a contact sensor, a motion sensor, or any other type of sensor included in a control unit system. The sensors 920 also may include an environmental sensor, such as a temperature sensor, a water sensor, a rain sensor, a wind sensor, a light sensor, a smoke detector, a carbon monoxide detector, an air quality sensor, etc. The sensors 920 further may include a health monitoring sensor, such as a prescription bottle sensor that monitors taking of prescriptions, a blood pressure sensor, a blood sugar sensor, a bed mat configured to sense presence of liquid (e.g., bodily fluids) on the bed mat, etc. In some examples, the sensors 920 may include a radio-frequency identification (RFID) sensor that identifies a particular article that includes a pre-assigned RFID tag.

The control unit 910 communicates with the module 922 and the camera 930 to perform monitoring. The module 922 is connected to one or more devices that enable home automation control. For instance, the module 922 may be connected to one or more lighting systems and may be configured to control operation of the one or more lighting systems. Also, the module 922 may be connected to one or more electronic locks at the property and may be configured to control operation of the one or more electronic locks (e.g., control Z-Wave locks using wireless communications in the Z-Wave protocol. Further, the module 922 may be connected to one or more appliances at the property and may be configured to control operation of the one or more appliances. The module 922 may include multiple modules that are each specific to the type of device being controlled in an automated manner. The module 922 may control the one or more devices based on commands received from the control unit 910. For instance, the module 922 may cause a lighting system to illuminate an area to provide a better image of the area when captured by a camera 930. The smart boards 976, 978, and 980 can allow for quick time to market of any new devices added to the electronic system 900.

The camera 930 may be a video/photographic camera or other type of optical sensing device configured to capture images. For instance, the camera 930 may be configured to capture images of an area within a building or within a residential property 102 monitored by the control unit 910. The camera 930 may be configured to capture single, static images of the area and also video images of the area in which multiple images of the area are captured at a relatively high frequency (e.g., thirty images per second). The camera 930 may be controlled based on commands received from the control unit 910.

The camera 930 may be triggered by several different types of techniques. For instance, a Passive Infra-Red (PIR) motion sensor may be built into the camera 930 and used to trigger the camera 930 to capture one or more images when motion is detected. The camera 930 also may include a microwave motion sensor built into the camera and used to trigger the camera 930 to capture one or more images when motion is detected. The camera 930 may have a "normally open" or "normally closed" digital input that can trigger capture of one or more images when external sensors (e.g., the sensors 920, PIR, door/window, etc.) detect motion or other events. In some implementations, the camera 930 receives a command to capture an image when external devices detect motion or another potential alarm event. The camera 930 may receive the command from the controller 912 or directly from one of the sensors 920.

In some examples, the camera 930 triggers integrated or external illuminators (e.g., Infra-Red, Z-wave controlled "white" lights, lights controlled by the module 922, etc.) to improve image quality when the scene is dark. An integrated or separate light sensor may be used to determine if illumination is desired and may result in increased image quality.

The camera 930 may be programmed with any combination of time/day schedules, system "arming state", or other variables to determine whether images should be captured or not when triggers occur. The camera 930 may enter a low-power mode when not capturing images. In this case, the camera 930 may wake periodically to check for inbound messages from the controller 912. The camera 930 may be powered by internal, replaceable batteries if located remotely from the control unit 910. The camera 930 may employ a small solar cell to recharge the battery when light is available. Alternatively, the camera 930 may be powered by the controller's 912 power supply if the camera 930 is co-located with the controller 912.

In some implementations, the camera 930 communicates directly with the monitoring application server 960 over the Internet. In these implementations, image data captured by the camera 930 does not pass through the control unit 910 and the camera 930 receives commands related to operation from the monitoring application server 960.

The system 900 also includes thermostat 934 to perform dynamic environmental control at the property. The thermostat 934 is configured to monitor temperature and/or energy consumption of an HVAC system associated with the thermostat 934, and is further configured to provide control of environmental (e.g., temperature) settings. In some implementations, the thermostat 934 can additionally or alternatively receive data relating to activity at a property and/or environmental data at a property, e.g., at various locations indoors and outdoors at the property. The thermostat 934 can directly measure energy consumption of the HVAC system associated with the thermostat, or can estimate energy consumption of the HVAC system associated with the thermostat 934, for example, based on detected usage of one or more components of the HVAC system associated with the thermostat 934. The thermostat 934 can communicate temperature and/or energy-monitoring information to or from the control unit 910 and can control the environmental (e.g., temperature) settings based on commands received from the control unit 910.

In some implementations, the thermostat 934 is a dynamically programmable thermostat and can be integrated with the control unit 910. For example, the dynamically programmable thermostat 934 can include the control unit 910, e.g., as an internal component to the dynamically programmable thermostat 934. In addition, the control unit 910 can be a gateway device that communicates with the dynamically programmable thermostat 934.

A module 937 is connected to one or more components of an HVAC system associated with a property, and is configured to control operation of the one or more components of the HVAC system. In some implementations, the module 937 is also configured to monitor energy consumption of the HVAC system components, for example, by directly measuring the energy consumption of the HVAC system components or by estimating the energy usage of the one or more HVAC system components based on detecting usage of components of the HVAC system. The module 937 can communicate energy-monitoring information and the state of the HVAC system components to the thermostat 934 and can control the one or more components of the HVAC system based on commands received from the thermostat 934.

In some examples, the system 900 further includes one or more robotic devices. The robotic devices may be any type of robots that are capable of moving and taking actions that assist in security-monitoring. For example, the robotic devices may include drones that are capable of moving throughout a property based on automated control technology and/or user input control provided by a user. In this example, the drones may be able to fly, roll, walk, or otherwise move about the property. The drones may include helicopter type devices (e.g., quad copters), rolling helicopter type devices (e.g., roller copter devices that can fly and also roll along the ground, walls, or ceiling) and land vehicle type devices (e.g., automated cars that drive around a property). In some cases, the robotic devices may be robotic devices that are intended for other purposes and merely associated with the system 900 for use in appropriate circumstances. For instance, a robotic vacuum cleaner device may be associated with the monitoring system 900 as one of the robotic devices and may be controlled to take action responsive to monitoring system events.

In some examples, the robotic devices automatically navigate within a property. In these examples, the robotic devices include sensors and control processors that guide movement of the robotic devices within the property. For instance, the robotic devices may navigate within the property using one or more cameras, one or more proximity sensors, one or more gyroscopes, one or more accelerometers, one or more magnetometers, a global positioning system (GPS) unit, an altimeter, one or more sonar or laser sensors, and/or any other types of sensors that aid in navigation about a space. The robotic devices may include control processors that process output from the various sensors and control the robotic devices to move along a path that reaches the desired destination and avoids obstacles. In this regard, the control processors detect walls or other obstacles in the property and guide movement of the robotic devices in a manner that avoids the walls and other obstacles.

In addition, the robotic devices may store data that describes attributes of the property. For instance, the robotic devices may store a floorplan and/or a three-dimensional model of the property that enables the robotic devices to navigate the property. During initial configuration, the robotic devices may receive the data describing attributes of the property, determine a frame of reference to the data (e.g., a home or reference location in the property), and navigate the property based on the frame of reference and the data describing attributes of the property. Further, initial configuration of the robotic devices also may include learning of one or more navigation patterns in which a user provides input to control the robotic devices to perform a specific navigation action (e.g., fly to an upstairs bedroom and spin around while capturing video and then return to a home charging base). In this regard, the robotic devices may learn and store the navigation patterns such that the robotic devices may automatically repeat the specific navigation actions upon a later request.

In some examples, the robotic devices may include data capture and recording devices. In these examples, the robotic devices may include one or more cameras, one or more motion sensors, one or more microphones, one or more biometric data collection tools, one or more temperature sensors, one or more humidity sensors, one or more air flow sensors, and/or any other types of sensors that may be useful in capturing monitoring data related to the property and users in the property. The one or more biometric data collection tools may be configured to collect biometric samples of a person in the home with or without contact of the person. For instance, the biometric data collection tools may include a fingerprint scanner, a hair sample collection tool, a skin cell collection tool, and/or any other tool that allows the robotic devices to take and store a biometric sample that can be used to identify the person (e.g., a biometric sample with DNA that can be used for DNA testing).

In some implementations, the robotic devices may include output devices. In these implementations, the robotic devices may include one or more displays, one or more speakers, and/or any type of output devices that allow the robotic devices to communicate information to a nearby user.

The robotic devices also may include a communication module that enables the robotic devices to communicate with the control unit 910, each other, and/or other devices. The communication module may be a wireless communication module that allows the robotic devices to communicate wirelessly. For instance, the communication module may be a Wi-Fi module that enables the robotic devices to communicate over a local wireless network at the property. The communication module further may be a 900 MHz wireless communication module that enables the robotic devices to communicate directly with the control unit 910. Other types of short-range wireless communication protocols, such as Bluetooth, Bluetooth LE, Zwave, Zigbee, etc., may be used to allow the robotic devices to communicate with other devices in the property.

The robotic devices further may include processor and storage capabilities. The robotic devices may include any suitable processing devices that enable the robotic devices to operate applications and perform the actions described throughout this disclosure. In addition, the robotic devices may include solid state electronic storage that enables the robotic devices to store applications, configuration data, collected sensor data, and/or any other type of information available to the robotic devices.

The robotic devices are associated with one or more charging stations. The charging stations may be located at predefined home base or reference locations in the property. The robotic devices may be configured to navigate to the charging stations after completion of tasks needed to be performed for the monitoring system 900. For instance, after completion of a monitoring operation or upon instruction by the control unit 910, the robotic devices may be configured to automatically fly to and land on one of the charging stations. In this regard, the robotic devices may automatically maintain a fully charged battery in a state in which the robotic devices are ready for use by the monitoring system 900.

The charging stations may be contact based charging stations and/or wireless charging stations. For contact based charging stations, the robotic devices may have readily accessible points of contact that the robotic devices are capable of positioning and mating with a corresponding contact on the charging station. For instance, a helicopter type robotic device may have an electronic contact on a portion of its landing gear that rests on and mates with an electronic pad of a charging station when the helicopter type robotic device lands on the charging station. The electronic contact on the robotic device may include a cover that opens to expose the electronic contact when the robotic device is charging and closes to cover and insulate the electronic contact when the robotic device is in operation.

For wireless charging stations, the robotic devices may charge through a wireless exchange of power. In these cases, the robotic devices need only locate themselves closely enough to the wireless charging stations for the wireless exchange of power to occur. In this regard, the positioning needed to land at a predefined home base or reference location in the property may be less precise than with a contact based charging station. Based on the robotic devices landing at a wireless charging station, the wireless charging station outputs a wireless signal that the robotic devices receive and convert to a power signal that charges a battery maintained on the robotic devices.

In some implementations, each of the robotic devices has a corresponding and assigned charging station such that the number of robotic devices equals the number of charging stations. In these implementations, the robotic devices always navigate to the specific charging station assigned to that robotic device. For instance, a first robotic device may always use a first charging station and a second robotic device may always use a second charging station.

In some examples, the robotic devices may share charging stations. For instance, the robotic devices may use one or more community charging stations that are capable of charging multiple robotic devices. The community charging station may be configured to charge multiple robotic devices in parallel. The community charging station may be configured to charge multiple robotic devices in serial such that the multiple robotic devices take turns charging and, when fully charged, return to a predefined home base or reference location in the property that is not associated with a charger. The number of community charging stations may be less than the number of robotic devices.

Also, the charging stations may not be assigned to specific robotic devices and may be capable of charging any of the robotic devices. In this regard, the robotic devices may use any suitable, unoccupied charging station when not in use. For instance, when one of the robotic devices has completed an operation or is in need of battery charge, the control unit 910 references a stored table of the occupancy status of each charging station and instructs the robotic device to navigate to the nearest charging station that is unoccupied.

The system 900 further includes a smart board 978, a smart board 976, and a smart board 980. The smart board 978 communicates with the camera 930 over the communication link 984. The smart board 976 communicates with the one or more sensors 922 over the communication link 982. The smart board 980 communicates with the thermostat 934 over the communication link 986. The one or more smart boards may allow camera 930, one or more sensors 922, and thermostat 934 to choose a different communication path to communicate with the one or more control units 910. Additionally, the one or more control units 910 may receive one or more sensor data from the sensors 920 and determine whether to provide an alert to the smart board 976. The one or more smart boards allow the camera 930, the one or more sensors 922, and the thermostat 934 to communicate with the user device N, the mobile device 940, the monitoring application server 960, and the central alarm station server 970 using wired or wireless data paths.

The sensors 920, the module 922, the camera 930, the thermostat 934, and the smart boards 976, 978, and 980 communicate with the controller 912 over communication links 924, 926, 928, 932, 982, 984, and 986. The communication links 924, 926, 928, 932, 982, 984, and 986 may be a wired or wireless data pathway configured to transmit signals from the sensors 920, the module 922, the camera 930, the thermostat 934, and the smart boards 976, 978, and 980 to the controller 912. Each of the smart boards 976, 978, and 980 includes a core board and a host board. The sensors 920, the module 922, the camera 930, and the thermostat 934, may continuously transmit sensed values to the controller 912, periodically transmit sensed values to the controller 912, or transmit sensed values to the controller 912 in response to a change in a sensed value. In some implementations, the smart boards 976, 978, and 980 can communicate with the monitoring application server 960 over network 905. The smart boards 976, 978, and 980 can connect and communicate with the monitoring application server 960 using a Wi-Fi or a cellular connection.

The communication links 924, 926, 928, 932, 982, 984, and 986 may include a local network. The sensors 920, the module 922, the camera 930, the thermostat 934, and the smart boards 976, 978, and 980, and the controller 912 may exchange data and commands over the local network. The local network may include 802.11 "Wi-Fi" wireless Ethernet (e.g., using low-power Wi-Fi chipsets), Z-Wave, Zigbee, Bluetooth, "Homeplug" or other "Powerline" networks that operate over AC wiring, and a Category 5 (CAT5) or Category 9 (CAT6) wired Ethernet network. The local network may be a mesh network constructed based on the devices connected to the mesh network.

The monitoring application server 960 is an electronic device configured to provide monitoring services by exchanging electronic communications with the control unit 910, the one or more user devices 940 and 950, and the central alarm station server 970 over the network 905. For example, the monitoring application server 960 may be configured to monitor events (e.g., alarm events) generated by the control unit 910. In this example, the monitoring application server 960 may exchange electronic communications with the network module 914 included in the control unit 910 to receive information regarding events (e.g., alerts) detected by the control unit 104. The monitoring application server 960 also may receive information regarding events (e.g., alerts) from the one or more user devices 940 and 950.

In some examples, the monitoring application server 960 may route alert data received from the network module 914 or the one or more user devices 940 and 950 to the central alarm station server 970. For example, the monitoring application server 960 may transmit the alert data to the central alarm station server 970 over the network 905.

The monitoring application server 960 may store sensor and image data received from the monitoring system and perform analysis of sensor and image data received from the monitoring system. Based on the analysis, the monitoring application server 960 may communicate with and control aspects of the control unit 910 or the one or more user devices 940 and 950.

The central alarm station server 970 is an electronic device configured to provide alarm monitoring service by exchanging communications with the control unit 910, the one or more mobile devices 940 and 950, and the monitoring application server 960 over the network 905. For example, the central alarm station server 970 may be configured to monitor alerting events generated by the control unit 910. In this example, the central alarm station server 970 may exchange communications with the network module 914 included in the control unit 910 to receive information regarding alerting events detected by the control unit 910. The central alarm station server 970 also may receive information regarding alerting events from the one or more mobile devices 940 and 950 and/or the monitoring application server 960.

The central alarm station server 970 is connected to multiple terminals 972 and 974. The terminals 972 and 974 may be used by operators to process alerting events. For example, the central alarm station server 970 may route alerting data to the terminals 972 and 974 to enable an operator to process the alerting data. The terminals 972 and 974 may include general-purpose computers (e.g., desktop personal computers, workstations, or laptop computers) that are configured to receive alerting data from a server in the central alarm station server 970 and render a display of information based on the alerting data. For instance, the controller 912 may control the network module 914 to transmit, to the central alarm station server 970, alerting data indicating that a sensor 920 detected motion from a motion sensor via the sensors 920. The central alarm station server 970 may receive the alerting data and route the alerting data to the terminal 972 for processing by an operator associated with the terminal 972. The terminal 972 may render a display to the operator that includes information associated with the alerting event (e.g., the lock sensor data, the motion sensor data, the contact sensor data, etc.) and the operator may handle the alerting event based on the displayed information.

In some implementations, the terminals 972 and 974 may be mobile devices or devices designed for a specific function. Although FIG. 6 illustrates two terminals for brevity, actual implementations may include more (and, perhaps, many more) terminals.

The one or more user devices 940 and 950 are devices that host and display user interfaces. For instance, the user device 940 is a mobile device that hosts one or more native applications (e.g., the smart home application 942). The user device 940 may be a cellular phone or a non-cellular locally networked device with a display. The user device 940 may include a cell phone, a smart phone, a tablet PC, a personal digital assistant ("PDA"), or any other portable device configured to communicate over a network and display information. For example, implementations may also include Blackberry-type devices (e.g., as provided by Research in Motion), electronic organizers, iPhone-type devices (e.g., as provided by Apple), iPod devices (e.g., as provided by Apple) or other portable music players, other communication devices, and handheld or portable electronic devices for gaming, communications, and/or data organization. The user device 940 may perform functions unrelated to the monitoring system, such as placing personal telephone calls, playing music, playing video, displaying pictures, browsing the Internet, maintaining an electronic calendar, etc.

The user device 940 includes a smart home application 942. The smart home application 942 refers to a software/firmware program running on the corresponding mobile device that enables the user interface and features described throughout. The user device 940 may load or install the smart home application 942 based on data received over a network or data received from local media. The smart home application 942 runs on mobile devices platforms, such as iPhone, iPod touch, Blackberry, Google Android, Windows Mobile, etc. The smart home application 942 enables the user device 940 to receive and process image and sensor data from the monitoring system.

The user device 950 may be a general-purpose computer (e.g., a desktop personal computer, a workstation, or a laptop computer) that is configured to communicate with the monitoring application server 960 and/or the control unit 910 over the network 905. The user device 950 may be configured to display a smart home user interface 952 that is generated by the user device 950 or generated by the monitoring application server 960. For example, the user device 950 may be configured to display a user interface (e.g., a web page) provided by the monitoring application server 960 that enables a user to perceive images captured by the camera 930 and/or reports related to the monitoring system. Although FIG. 9 illustrates two user devices for brevity, actual implementations may include more (and, perhaps, many more) or fewer user devices.

In some implementations, the one or more user devices 940 and 950 communicate with and receive monitoring system data from the control unit 910 using the communication link 938. For instance, the one or more user devices 940 and 950 may communicate with the control unit 910 using various local wireless protocols such as Wi-Fi, Bluetooth, Zwave, Zigbee, HomePlug (ethernet over powerline), or wired protocols such as Ethernet and USB, to connect the one or more user devices 940 and 950 to local security and automation equipment. The one or more user devices 940 and 950 may connect locally to the monitoring system and its sensors and other devices. The local connection may improve the speed of status and control communications because communicating through the network 905 with a remote server (e.g., the monitoring application server 960) may be significantly slower.

Although the one or more user devices 940 and 950 are shown as communicating with the control unit 910, the one or more user devices 940 and 950 may communicate directly with the sensors and other devices controlled by the control unit 910. In some implementations, the one or more user devices 940 and 950 replace the control unit 910 and perform the functions of the control unit 910 for local monitoring and long range/offsite communication.

In other implementations, the one or more user devices 940 and 950 receive monitoring system data captured by the control unit 910 through the network 905. The one or more user devices 940, 950 may receive the data from the control unit 910 through the network 905 or the monitoring application server 960 may relay data received from the control unit 910 to the one or more user devices 940 and 950 through the network 905. In this regard, the monitoring application server 960 may facilitate communication between the one or more user devices 940 and 950 and the monitoring system.

In some implementations, the one or more user devices 940 and 950 may be configured to switch whether the one or more user devices 940 and 950 communicate with the control unit 910 directly (e.g., through link 938) or through the monitoring application server 960 (e.g., through network 905) based on a location of the one or more user devices 940 and 950. For instance, when the one or more user devices 940 and 950 are located close to the control unit 910 and in range to communicate directly with the control unit 910, the one or more user devices 940 and 950 use direct communication. When the one or more user devices 940 and 950 are located far from the control unit 910 and not in range to communicate directly with the control unit 910, the one or more user devices 940 and 950 use communication through the monitoring application server 960.

Although the one or more user devices 940 and 950 are shown as being connected to the network 905, in some implementations, the one or more user devices 940 and 950 are not connected to the network 905. In these implementations, the one or more user devices 940 and 950 communicate directly with one or more of the monitoring system components and no network (e.g., Internet) connection or reliance on remote servers is needed.

In some implementations, the one or more user devices 940 and 950 are used in conjunction with only local sensors and/or local devices in a house. In these implementations, the system 900 only includes the one or more user devices 940 and 950, the sensors 920, the module 922, the camera 930, and the robotic devices. The one or more user devices 940 and 950 receive data directly from the sensors 920, the module 922, the camera 930, and the robotic devices and sends data directly to the sensors 920, the module 922, the camera 930, and the robotic devices. The one or more user devices 940, 950 provide the appropriate interfaces/processing to provide visual surveillance and reporting.

In other implementations, the system 900 further includes network 905 and the sensors 920, the module 922, the camera 930, the thermostat 934, and the robotic devices are configured to communicate sensor and image data to the one or more user devices 940 and 950 over network 905 (e.g., the Internet, cellular network, etc.). In yet another implementation, the sensors 920, the module 922, the camera 930, the thermostat 934, and the robotic devices (or a component, such as a bridge/router) are intelligent enough to change the communication pathway from a direct local pathway when the one or more user devices 940 and 950 are in close physical proximity to the sensors 920, the module 922, the camera 930, the thermostat 934, and the robotic devices to a pathway over network 905 when the one or more user devices 940 and 950 are farther from the sensors 920, the module 922, the camera 930, the thermostat 934, and the robotic devices. In some examples, the system leverages GPS information from the one or more user devices 940 and 950 to determine whether the one or more user devices 940 and 950 are close enough to the sensors 920, the module 922, the camera 930, the thermostat 934, and the robotic devices to use the direct local pathway or whether the one or more user devices 940 and 950 are far enough from the sensors 920, the module 922, the camera 930, the thermostat 934, and the robotic devices that the pathway over network 905 is required. In other examples, the system leverages status communications (e.g., pinging) between the one or more user devices 940 and 950 and the sensors 920, the module 922, the camera 930, the thermostat 934, and the robotic devices to determine whether communication using the direct local pathway is possible. If communication using the direct local pathway is possible, the one or more user devices 940 and 950 communicate with the sensors 920, the module 922, the camera 930, the thermostat 934, and the robotic devices using the direct local pathway. If communication using the direct local pathway is not possible, the one or more user devices 940 and 950 communicate with the sensors 920, the module 922, the camera 930, the thermostat 934, and the robotic devices using the pathway over network 905.

In some implementations, the system 900 provides end users with access to images captured by the camera 930 to aid in decision making. The system 900 may transmit the images captured by the camera 930 over a wireless WAN network to the user devices 940 and 950. Because transmission over a wireless WAN network may be relatively expensive, the system 900 uses several techniques to reduce costs while providing access to significant levels of useful visual information.

In some implementations, a state of the monitoring system and other events sensed by the monitoring system may be used to enable/disable video/image recording devices (e.g., the camera 930). In these implementations, the camera 930 may be set to capture images on a periodic basis when the alarm system is armed in an "Away" state, but set not to capture images when the alarm system is armed in a "Stay" state or disarmed. In addition, the camera 930 may be triggered to begin capturing images when the alarm system detects an event, such as an alarm event, a door-opening event for a door that leads to an area within a field of view of the camera 930, or motion in the area within the field of view of the camera 930. In other implementations, the camera 930 may capture images continuously, but the captured images may be stored or transmitted over a network when needed.

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially designed ASICs (application-specific integrated circuits).

It will be understood that various modifications may be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

What is claimed is:

1. A monitoring system that is configured to monitor a property, the monitoring system comprising:
 a sensor that is configured to generate sensor data that reflects an attribute of the property and that comprises:
  a host board that is configured to generate the sensor data; and
  a core board that is connected to the host board, that is configured to identify a type of the host board, and that is configured to communicate with a monitor control unit; and
 the monitor control unit that is configured to:
  receive, from the core board of the sensor, a request for firmware associated with the type of the host board;
  in response to receiving the request for firmware associated with the type of the host board, access the firmware associated with the type of the host board; and
  transmit, to the core board of the sensor, the firmware associated with the type of the host board,
 wherein the core board of the sensor is configured to:
  receive the firmware associated with the type of the host board;
  store the firmware associated with the type of the host board;
  receive, from the host board, the sensor data; and
  transmit, to the monitor control unit, the sensor data.

2. The monitoring system of claim 1, wherein the core board is configured to:
 connect to the host board through an adaptable connector that comprises one or more pin connectors;
 retrieve the firmware associated with the type of the host board from a memory of the core board; and
 configure a function of the one or more pin connectors based on the firmware associated with the type of the host board.

3. The monitoring system of claim 2, wherein:
 the one or more pin connectors comprises multi-function pins and single function pins, and
 a function of each of the multi-function pins is configured to change based on the type of the host board.

4. The monitoring system of claim 2, wherein a pin connector layout of the adaptable connector comprises 22 multi-function purpose pins, 23 power and ground pins, and 21 single function pins.

5. The monitoring system of claim 2, wherein the core board is configured to:
 maintain the one or more pin connectors in RESET mode until configuring the function of the one or more pin connectors based on the firmware associated with the type of the host board.

6. The monitoring system of claim 2, wherein the core board is configured to identify a type of the host board by:
 transmitting a request to a memory of the host board; and
 receiving data identifying the type of the host board from the memory of the host board.

7. The monitoring system of claim 6, wherein the data identifying the type of the host board comprises unique serial information of the host board, data indicating a product type of the host board, and a pin configuration for the one or more pin connectors based on the product type of the host board.

8. The monitoring system of claim 1, wherein the monitor control unit is configured to receive the request for firmware associated with the type of the host board by:
 receiving unique serial information associated with a product type of the host board and data instructing the monitor control unit to transmit a request to a security server for the requested firmware.

9. The monitoring system of claim 1, wherein the monitor control unit is configured to:
 in response to accessing the firmware associated with the type of the host board, transmit a notification to a client device indicating that firmware has been requested for the core board;
 transmit the firmware to the core board;
 receive a notification from the core board indicating that the core board is configured to communicate with the host board; and
 in response to receiving the notification from the core board indicating that the core board is configured to communicate with the host board, transmit an additional notification to the client device indicating that the core board is functioning properly with the host board.

10. The monitoring system of claim 1, wherein the core board comprises one or more add-on boards that provide additional functionality to the core board and the host board.

11. The monitoring system of claim 1, wherein the core board is configured to:
 connect to an additional host board that is different from the host board;
 identify a type of the additional host board;
 determine additional firmware corresponding to the additional host board is not locally found on the core board;
 transmit a request to the monitor control unit for the additional firmware;
 receive the additional firmware from the monitor control unit; and configure a function of one or more pin connectors based on the additional firmware associated with a type of the additional host board.

12. The monitoring system of claim 11, wherein the type of the additional host board is a thermostat specific host board and the type of the host board is a smoke sensor specific host board.

13. A computer-implemented method, comprising:
determining, by a sensor that is located at a property and that includes a host board and a core board that is connected to the host board, a type of the host board;
based on the type of the host board, transmitting, by the sensor and to a monitoring system that is configured to monitor a property, a request for firmware associated with the type of host board;
receiving, by the sensor and from the monitoring system, the firmware associated with the type of the host board;
storing, by the sensor, the firmware associated with the type of the host board;
based on storing the firmware associated with the type of the host board, generating, by the sensor, sensor data that reflects an attribute of the property; and
transmitting, by the sensor and to the monitoring system, the sensor data.

14. The method of claim 13, comprising:
connecting, by the sensor, the core board through the host board through an adaptable connector that comprises one or more pin connectors;
retrieving, by the sensor, the firmware associated with the type of the host board from a memory of the core board; and
configuring, by the sensor, a function of the one or more pin connectors based on the firmware associated with the type of the host board.

15. The method of claim 14, wherein:
the one or more pin connectors comprises multi-function pins and single function pins, and
a function of each of the multi-function pins is configured to change based on the type of the host board.

16. The method of claim 14, wherein a pin connector layout of the adaptable connector comprises 22 multi-function purpose pins, 23 power and ground pins, and 21 single function pins.

17. The method of claim 14, comprising:
maintaining, by the sensor, the one or more pin connectors in RESET mode until configuring the function of the one or more pin connectors based on the firmware associated with the type of the host board.

18. The method of claim 14, comprising:
transmitting, by the core board of the sensor, a request to a memory of the host board; and
receiving, by the core board of the sensor, data identifying the type of the host board from the memory of the host board.

19. The method of claim 18, wherein the data identifying the type of the host board comprises unique serial information of the host board, data indicating a product type of the host board, and a pin configuration for the one or more pin connectors based on the product type of the host board.

20. The method of claim 13, wherein transmitting the request for the firmware associated with the type of the host board comprises:
transmitting, by the sensor and to the monitoring system, unique serial information associated with a product type of the host board and data instructing the monitoring system to transmit a request to a security server for the requested firmware.

* * * * *